United States Patent [19]

Asano et al.

[11] Patent Number: 5,490,232
[45] Date of Patent: Feb. 6, 1996

[54] COMPUTER-AIDED THOUGHT PROCESS SIMULATION DESIGN SYSTEM

[75] Inventors: Norihide Asano, Nara; Chiaki Sakai, Hyogo; Masanobu Momota, Osaka, all of Japan

[73] Assignee: Daiwa House Industry Co., Ltd., Osaka, Japan

[21] Appl. No.: 223,324

[22] Filed: Apr. 5, 1994

Related U.S. Application Data

[63] Continuation-in-part of Ser. No. 769,642, Oct. 1, 1991, abandoned.

[30] Foreign Application Priority Data

Oct. 25, 1990 [JP] Japan ..................... 2-288115

[51] Int. Cl.$^6$ ................. G06F 15/18; G06F 15/60
[52] U.S. Cl. ................. 395/10; 395/919; 395/921; 364/512; 364/488
[58] Field of Search ............. 395/10, 919, 921; 364/512, 488

[56] References Cited

U.S. PATENT DOCUMENTS

| | | | |
|---|---|---|---|
| 4,651,284 | 3/1987 | Watanabe et al. | 395/921 |
| 4,912,657 | 3/1990 | Saxton et al. | 395/155 |
| 5,016,204 | 5/1991 | Simoudis et al. | 395/920 |

OTHER PUBLICATIONS

Hruschka, P., "Towards An Object Oriented Method for System Architecture Design," Proc. 1990 IEEE Intl. Conf. on Computer Systems and Software Engineering, May 1990, 12–17.

Hekmatpour et al., "KIDEN: Knowledge-based INtelligent VLSI Design ENvironment," Proc. 5th Annual AI Systems in Government Conf., May 1990, 96–103.

Feghhi et al., "An Object–Oriented Kernel for an Integrated Design and Process Planning System", 27th ACM/IEEE Design Automation Conf., Jun. 1990, 437–443.

Gupta et al., "An Object–Oriented VLSI CAD Framework," IEEE Computer, May 1989, 28–37.

Takeda et al., "Modeling Design Processes", AI Magazine, Winter 1990, 37–48.

Chandrasekaran, B., "Design Problem Solving: A Task Analysis", AI Magazine, Winter 1990, 59–71.

Hekmatpour et al., "KINFIDA: An Object–Oriented Model–Based Digital Filter Design Assistant," 1990 Intl. Conf. on Acoustics, Speech and Signal Processing, Apr. 1990, 1069–1072.

Chung et al., "VHDL in an Object–Oriented VLSI Design Environment", COMPCON Spring 88, 33rd IEEE Computer Society Intl. Conf., Mar. 1988, 324–327.

van der Meulen et al., "EXIST: an Interactive VLSI Architectural Environment", Proc. 1988 IEEE Intl. Conf. on Computer Design, Oct. 1988, 312–319.

McFadden, F. R., "Object–oriented Techniques in Computer Integrated Manufacturing", Proc. 22nd Annual Hawaii Intl. Conf. on System Sciences, Jan. 1989, 64–69.

(List continued on next page.)

*Primary Examiner*—David K. Moore
*Assistant Examiner*—A. Katbab
*Attorney, Agent, or Firm*—Wenderoth, Lind & Ponack

[57] ABSTRACT

A computer-aided design system simulates the designer thought processes by the provision of a plurality of discrete unit programs provided respectively for individual design items, Each of the unit programs includes a thought process portion, a knowledge portion and a recognition portion. The thought process portion is for receiving an input instruction via an input device, executing logic operations in accordance with the input instruction to obtain logic results, and transferring the logic results to a related unit program. The related unit program receives the logic results and executes logic operations in accordance with the received logic results to obtain new logic results. The knowledge portion of each unit program is provided for storing the various logic results, and the recognition portion of each unit program is provided for identifying the related unit program which is related to the logic results obtained by executing the logic operations.

18 Claims, 26 Drawing Sheets

OTHER PUBLICATIONS

Wolf, W. H., "How to Build a Hardware Description and Measurement System on an Object–Oriented Programming Language", IEEE Trans. on Computer–Aided Design, vol. 8, Mar. 1989, 288–301.

Walker, I., "A Smalltalk/V VLSI CAD application," Computer–Aided Engineering Journal, Apr. 1991, 47–53.

FIG. 11

| PART NAME | MATERIAL CODE | MATERIAL NAME | QUANTITY | UNIT |
|---|---|---|---|---|
| OUTER WALL | 001 | FASHION ALC PLATE | 227.80 | $m^2$ |
| | 112 | BASIC LATTICE 25*95 | 227.80 | $m^2$ |
| | 105 | ASBESTOS BOARD | 227.80 | $m^2$ |
| ROOF | 003 | ALBANY WOOD CHIP | 190.81 | $m^2$ |
| | 104 | CEMENT BOARD | 190.81 | $m^2$ |
| FLOOR | 006 | CARPET | 120.00 | $m^2$ |
| | 010 | TATAMI | 80.00 | $m^2$ |
| | 101 | MORTAR | 4.00 | $m^3$ |
| | 103 | ALC BOARD | 200.00 | $m^2$ |
| CEILING | 009 | CROSS ASBESTOS BOARD | 200.00 | $m^2$ |
| | 105 | BASIC LATTICE | 400.00 | $m^2$ |
| | 112 | BASIC LATTICE 25*95 | 200.00 | $m^2$ |

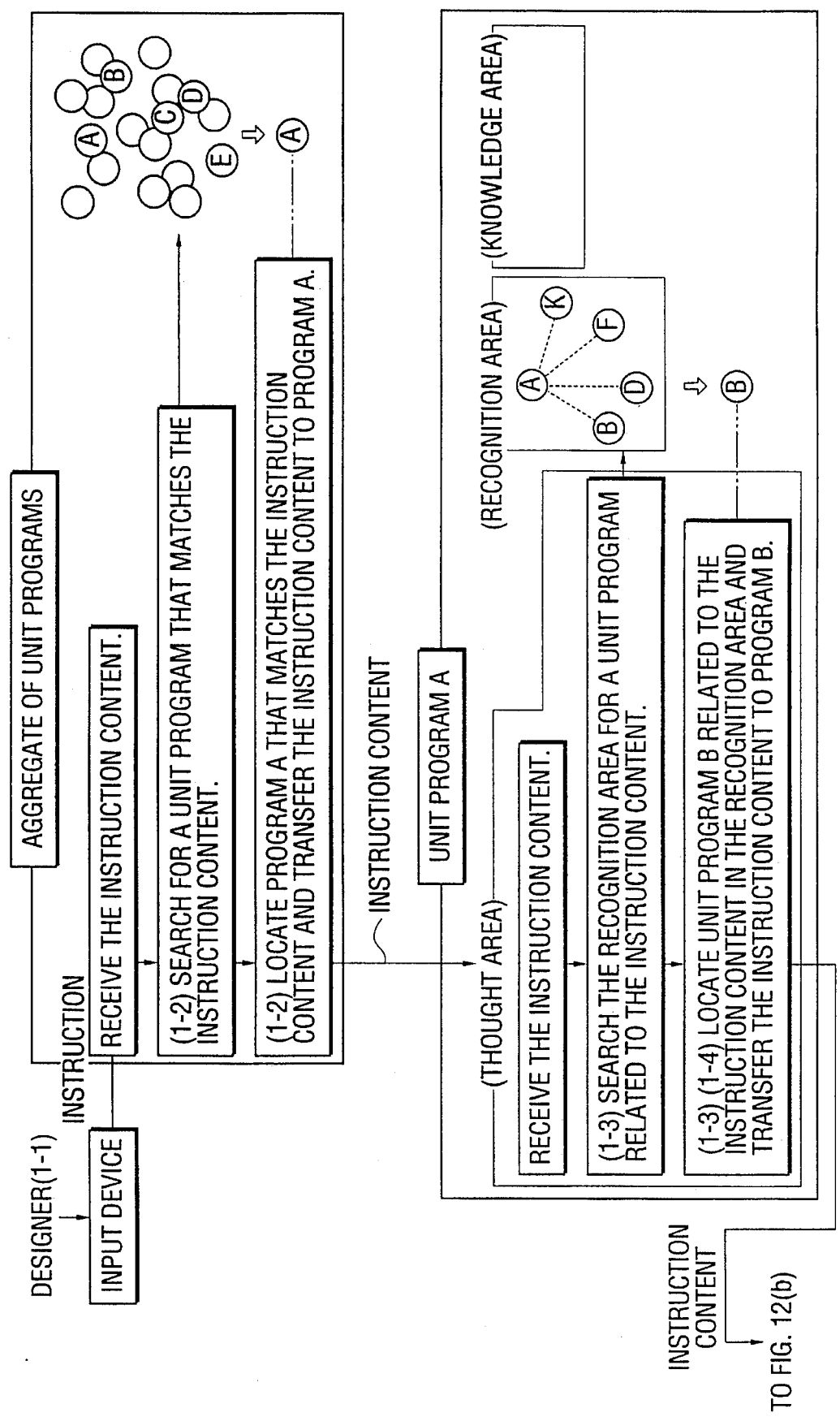

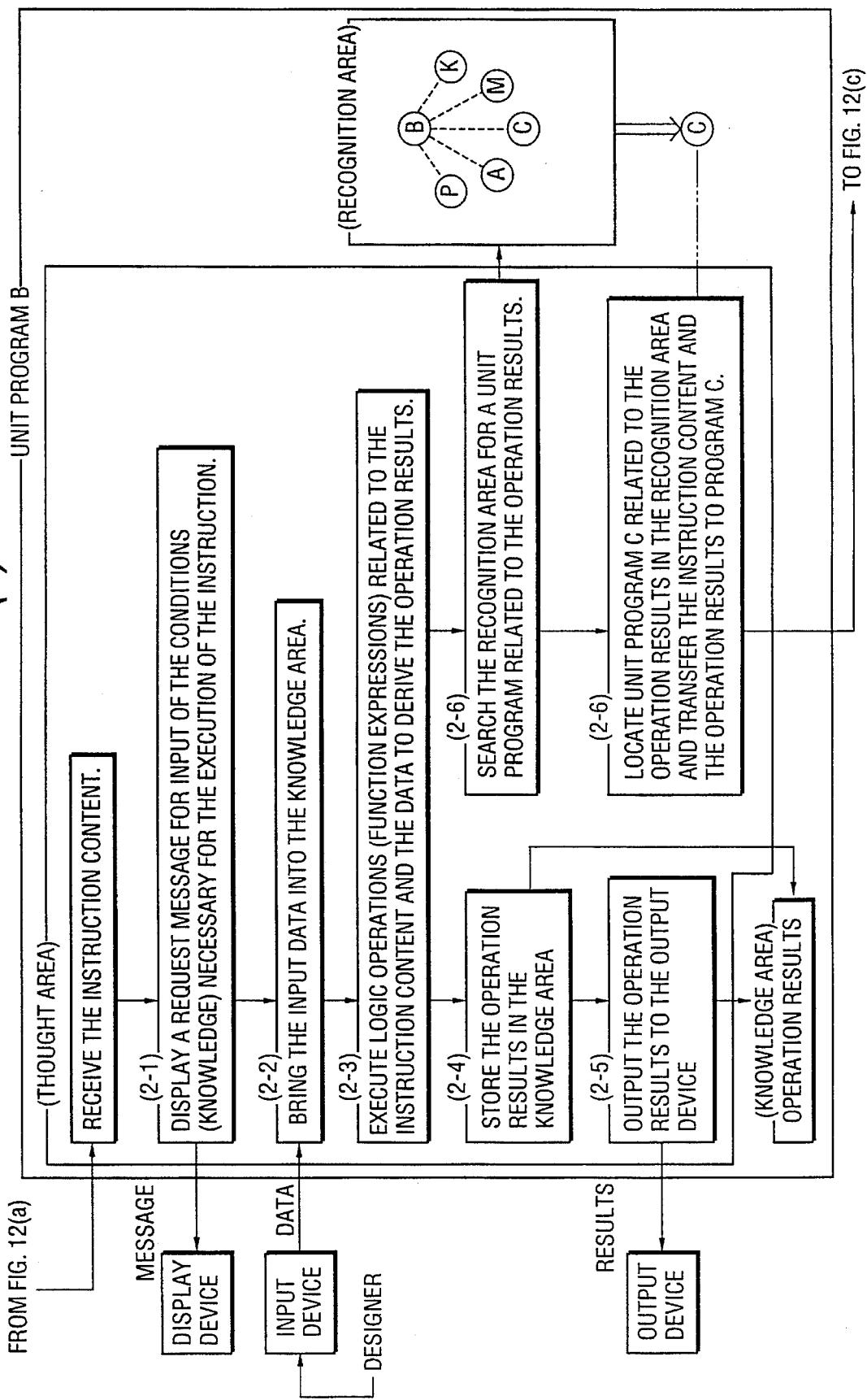

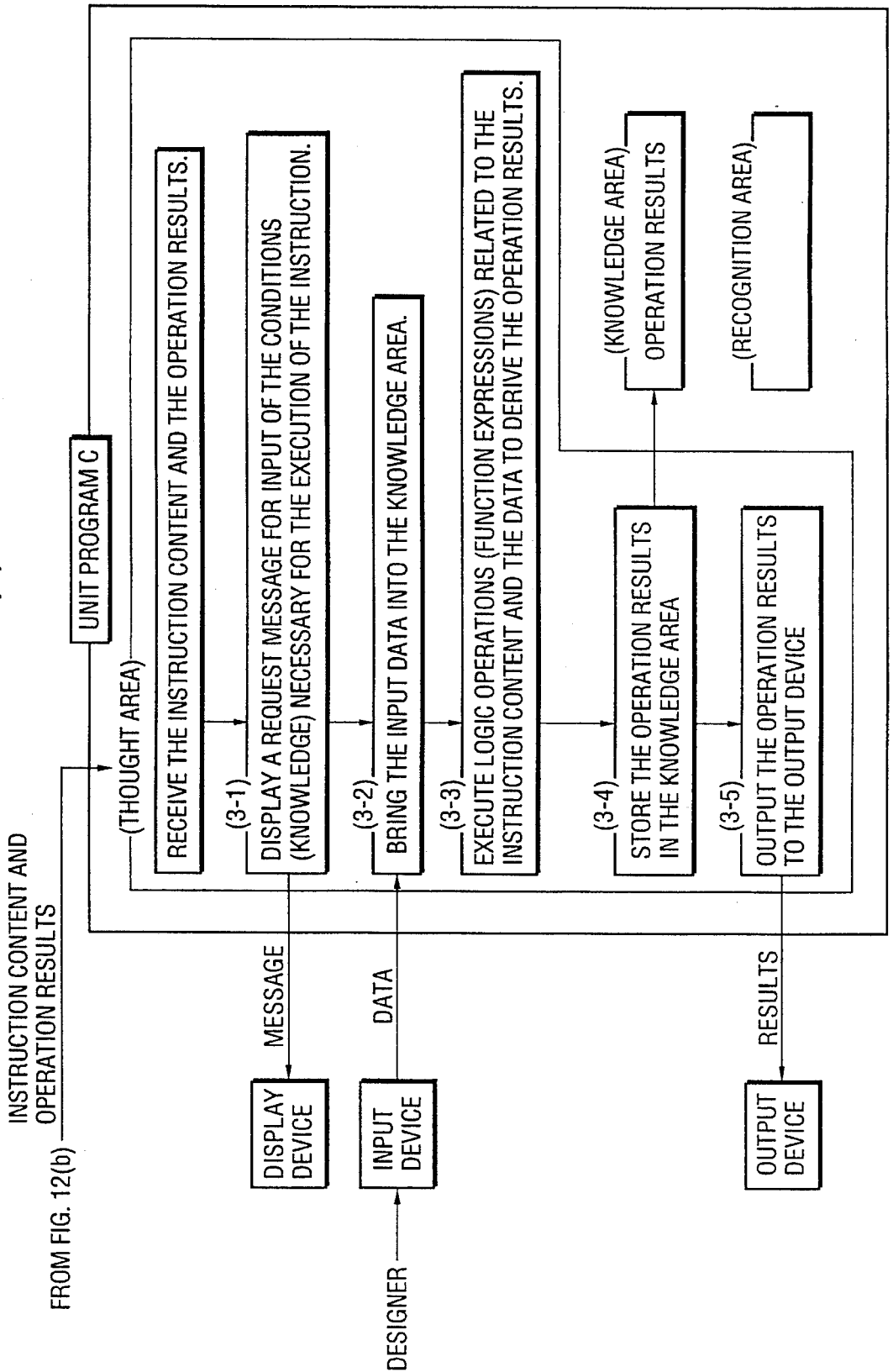

FIG. 13(a)
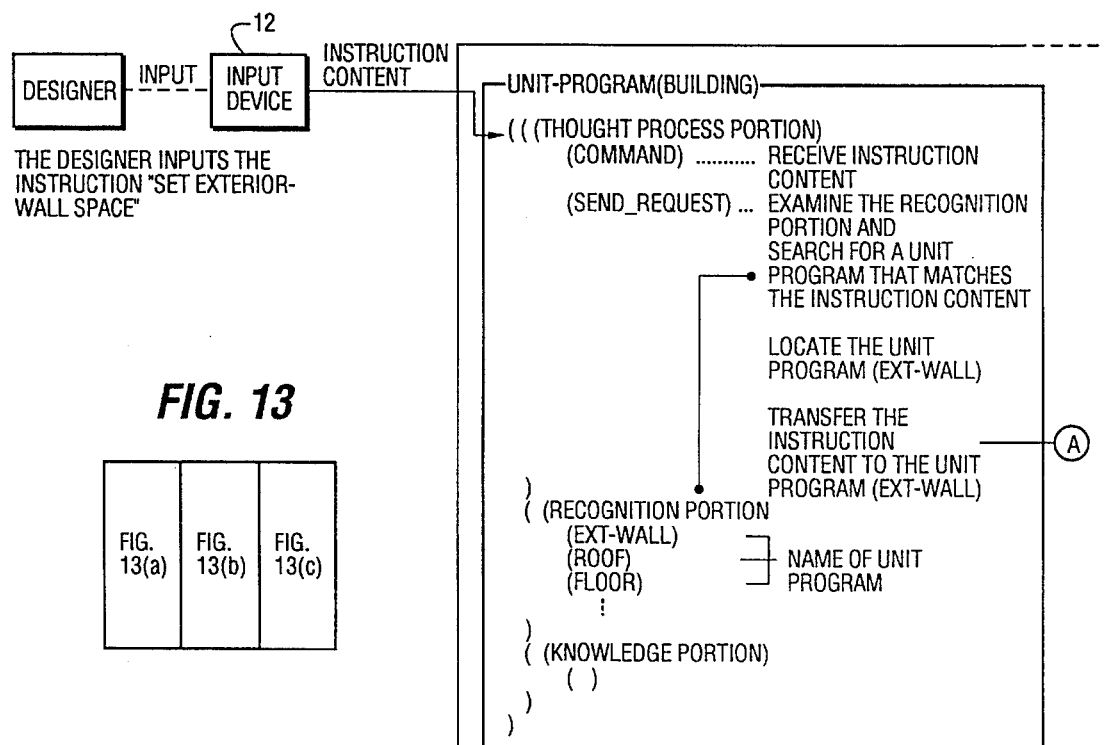
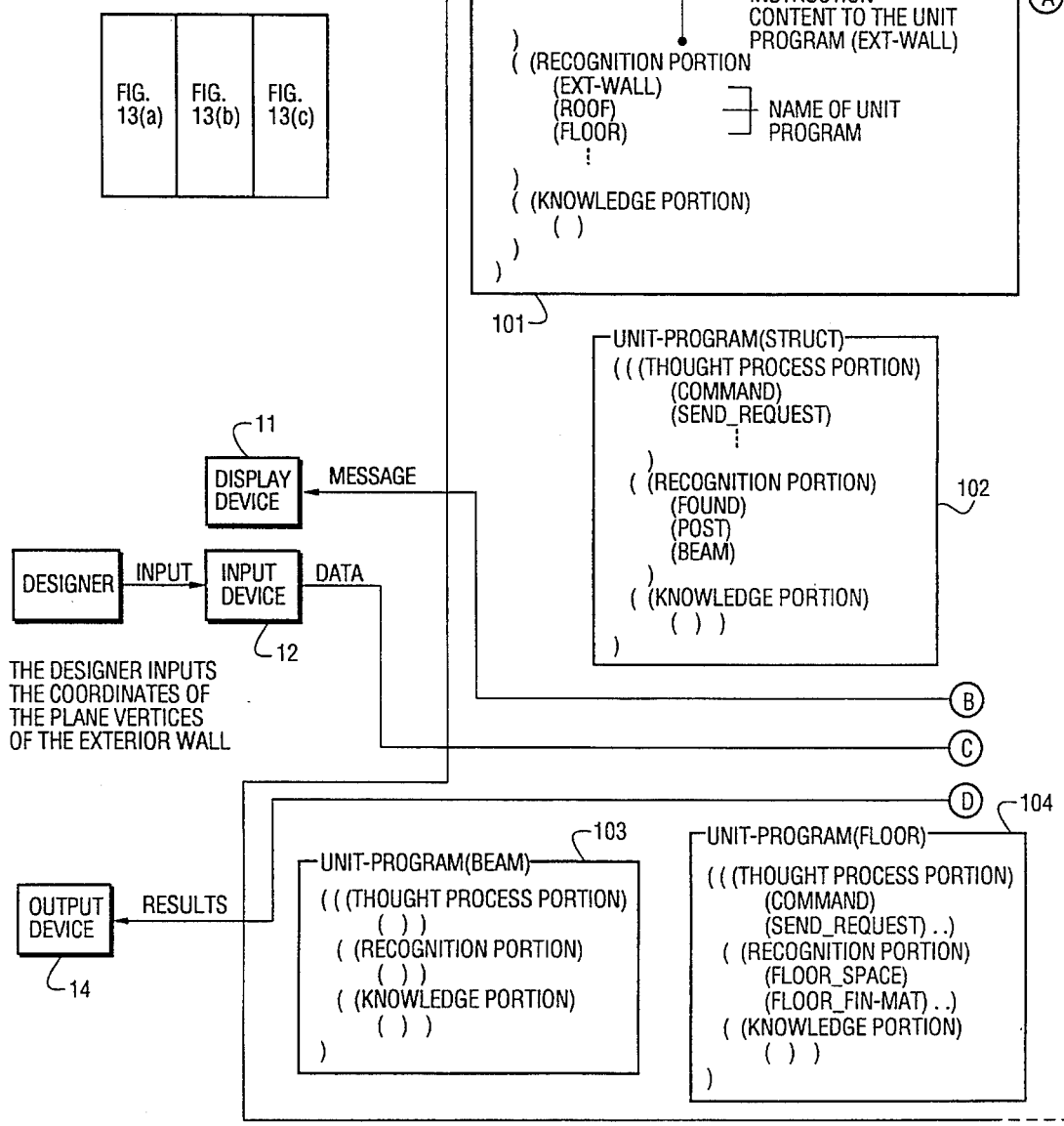

FIG. 13(c)
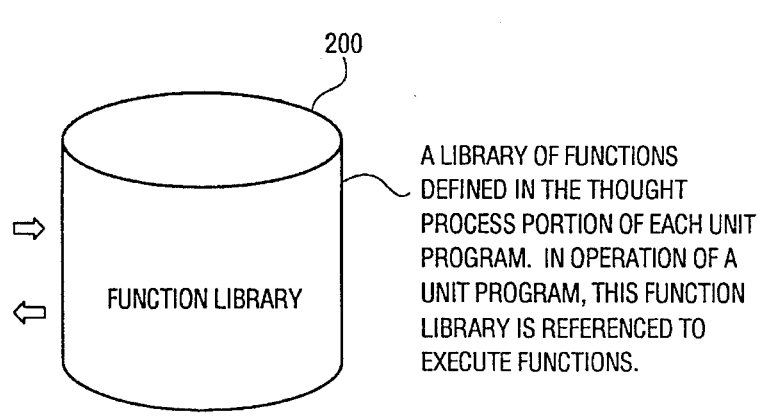
A LIBRARY OF FUNCTIONS DEFINED IN THE THOUGHT PROCESS PORTION OF EACH UNIT PROGRAM. IN OPERATION OF A UNIT PROGRAM, THIS FUNCTION LIBRARY IS REFERENCED TO EXECUTE FUNCTIONS.
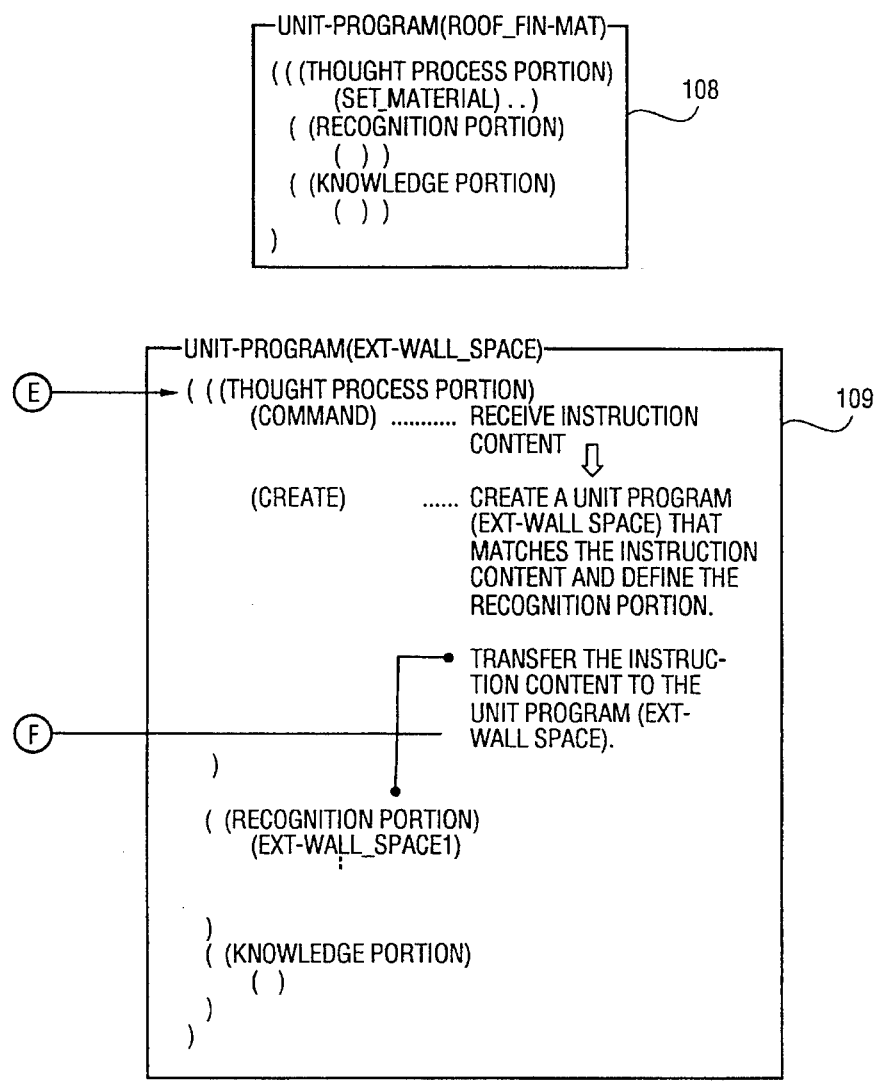

FIG. 14(d)

```
┌─UNIT-PROGRAM[EXTERIOR-WALL_SPACE1]─────────────────────────────────┐
│ ( ( (THOUGHT PROCESS PORTION)
│     (DEFUN SET_PLANE()
│       (LET (RET METHOD PLANE_VERTEX)
│         (IF (EQUAL CANCEL (MULTIPLE-VALUE-SETQ (RET METHOD)
│ (E)       (SINTIN "(1)VERTICAL-PLANE  (2)FREE-PLANE" :DFINT 1 :INMAX 2 :INMIN 1)))
│               (RETURN-FROM SET_SPACE NIL) )                          (D)
│         (COND
│ (F)       ( (=METHOD 1)
│             (IF (NULL (SETQ PLANE_VERTEX (SMAKE VERTICAL PLANE) ) )
│                 (RETURN-FROM SET_PLANE NIL) )
│ (G)         (SSET '(SELF) (LIST (LIST 'PLANE_VERTEX PLANE_VERTEX) ) ) )
│           ( (=METHOD 2)
│             (IF (NULL (SETQ PLANE_VERTEX (SMAKE_FREE_PLANE) ) )
│                 (RETURN-FROM SET_PLANE NIL) )
│ (H)         (SSET ' (SELF) (LIST (LIST 'PLANE_VERTEX PLANE_VERTEX) ) ) )
│         (SSET ' (SELF) (LIST 'DRAW_COLOR G_WHITE) ) )
│         (SREQUEST ' (SELF) ' DRAW NIL)
│         (SSLEEP ' (SELF) ' (SET_PLANE) ) ) )
│     (DEFUN SGCOM_SET()
│       (LET (UNIT-PROGRAM_NAME VARIABLE_NAME VARIABLE_DATA RET)
│         (IF (EQUAL CANCEL (MULTIPLE-VALUE-SETQ (RET UNIT-PROGRAM_NAME)
│             (SSYMBOLIN "UNIT-PROGRAM_NAME" IDFSYM *CURRENT_UNIT-PROGRAM*) ) )
│           (RETURN-FROM SGCOM_SET NIL) )
│         (IF (NOT (EQUAL NORMAL_IN (MULTIPLE-VALUE-SETQ (RET VARIABLE_NAME)
│             (SSYMBOLIN "PARAMETER_NAME") ) )
│           (RETURN-FROM SGCOM_SET NIL) )
│         (IF (NOT (EQUAL NORMAL_IN (MULTIPLE-VALUE-SETQ (RET VARIABLE_DATA)
│             (SSYMBOLIN "PARAMETER_DATA") ) )
│           (RETURN-FROM SGCOM_SET NIL) )
│         (SSET (LIST UNIT-PROGRAM_NAME)
│               (LIST VARIABLE_NAME VARIABLE_DATA) ) ) ) )
│     (DEFUN DRAW_PLANE (PLANE_VERTEX COLOR)
│ (I)   (SDRAW PLANE PLANE_VERTEX :COLOR COLOR) ) )
│   ( (RECOGNITION PORTION)
│       ( ) )
│   ( (KNOWLEDGE PORTION)
│       ( (X1, Y1, Z1) (X2, Y2, Z2) (X3, Y3, Z3) (X4, Y4, Z4) ) )
└────────────────────────────────────────────────────────────────────┘
```

FIG. 14(e)

```
———UNIT-PROGRAM[EXTERIOR-WALL_SPACE]———
(((THOUGHT PROCESS PORTION)
    (DEFUN SET_COMPO_EXT-WALL_SPACE()
        (LET (CHILD)
            (SCREATE UNIT-PROGRAM 'EXT-WALL :MOTHER 'COMPO_EXT-WALL)
            (SETQ CHILD (CAR (LAST (SREF CHILDREN UNIT-PROGRAM 'COMPO_EXT-WALL))))
            (SSEND REQUEST (LIST CHILD) 'SET_EXTERIOR-WALL-SPACE NIL)))
 ((RECOGNITION PORTION)
    ((EXTERIOR-WALL_SPACE1) )                                     [EXTERIOR-WALL_SPACE1]
 ((KNOWLEDGE PORTION)
    ( )))
```

RESULTS OF THE CALCULATION PROCESS ARE OUTPUT

RESULTS OF THE CALCULATION PROCESS ARE OUTPUT

COMPUTER-AIDED THOUGHT PROCESS SIMULATION DESIGN SYSTEM

This is a continuation-in-part of application Ser. No. 07/769,642, filed Oct. 1, 1991, now abandoned.

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

This invention relates to a computer-aided design system, and more particularly, to a computer-aided design system which supports in an interactive basis the creative and expressive activities of a designer.

2. Field of the Related Art

The design processes of a designer may be categorized into "creative activities" and "expressive activities". Such a design process is illustrated in FIG. 1. The creative activities of a designer include sequentially expanding a combination of certain items of knowledge (and logic results related to such items of knowledge) to achieve a design objective which has been established by the designer. The expressive activities include representing in the form of drawings or the like a design product which may be deemed the final result realized by the creative activities of the designer.

Conventional computer-aided design systems (known as CAD systems) may be categorized into two general types, i.e., systems of the type which simply (geometrically) support the expressive activities of the designer, and systems of the type which support a standardized portion of the design process through a continuation of expressive activities. In other words, the conventional computer-aided design systems generally support only the various expressive activities of the designer.

Such conventional systems have significant drawbacks. In particular, the conventional computer-aided design system cannot support or simulate the creative activities of the designer in achieving the design objective. That is, referring again to FIG. 1, such systems are unable to carry out and simulate the series of thought processes of the designer. Further, with respect to the conventional computer-aided design system mentioned above which supports a standardized portion of the design process through a continuation of expressive activities, such system generally entail a relatively increased size and involve a higher consumption of labor resources. Further, such conventional systems include additional difficulties. That is, each time a new product is to be produced, a new system has to be prepared which is compatible with the new product. Further, since the processing flow of the system is preset, prompt design changes are not feasible. Still further, such systems naturally cannot be applied for simulation of a new product design.

Although various attempts to support and emulate the thought processes of the designer and research in the subject of "intelligent CAD" have been conducted, sufficient analysis and construction of the structure of the designer thought processes has not been realized, and therefore, an "intelligent CAD" system has not yet been developed.

SUMMARY OF THE INVENTION

The present invention is directed to obviating the drawbacks of the conventional computer-aided design systems by the provision of a computer-aided design system which supports the thought processes of the designer.

Particularly, it is an object of the present invention to provide a computer-aided thought process simulation design system which supports not only the design product representation, but which also supports the entire design process including the creative activities and the expressive activities of the designer.

The present invention is intended to provide a novel computer-aided thought process simulation design system which eliminates the necessity of preparing a new system for each new product, and which facilitates design changes and enables simulation of a new product design.

To achieve the foregoing objectives, the computer-aided thought process simulation design system of the present invention includes a plurality of unit programs each having a thought process portion, a knowledge portion, and a recognition portion. The plurality of unit programs are prepared for respective individual design items. A link is provided, which is operative in connection with the unit program processing, for recognizing other unit programs in accordance with information derived from the recognition portion of the unit program. An interactive input device is provided in combination with the display device. Also, a plotter device for outputting data stored in the unit program and design data may also be provided.

The design system according to the present invention takes the form of an aggregate of unit programs and is therefore easily applied to new product designs by, for example, the addition of new unit programs. Therefore, it is unnecessary to prepare a new system for each new design product.

Further, the design system according to the present invention affords greater ease of design change since the unit programs are designed particularly for each design item and since there is no preset processing flow. Further, the invention provides for easy and prompt design simulation for any new product since the unit programs are designed particularly for each design item.

BRIEF DESCRIPTION OF THE DRAWINGS

FIGS. 7–11 are views illustrating examples of the design results displayed according to the system of the present invention;

FIGS. 12(a)–12(c) constitute a flow chart of the processing in accordance with the system of the present invention;

FIGS. 13 and 13(a)–(c) depict a conceptual illustration of the system of the present invention;

FIGS. 14(a)–(f) depict a conceptual illustration and program code listings of the system of the present invention.

DETAILED DESCRIPTION OF THE PREFERRED EMBODIMENT

An embodiment of the computer-aided thought process simulation design system in accordance with the present invention will now be described with reference to the drawings.

Figure 1:
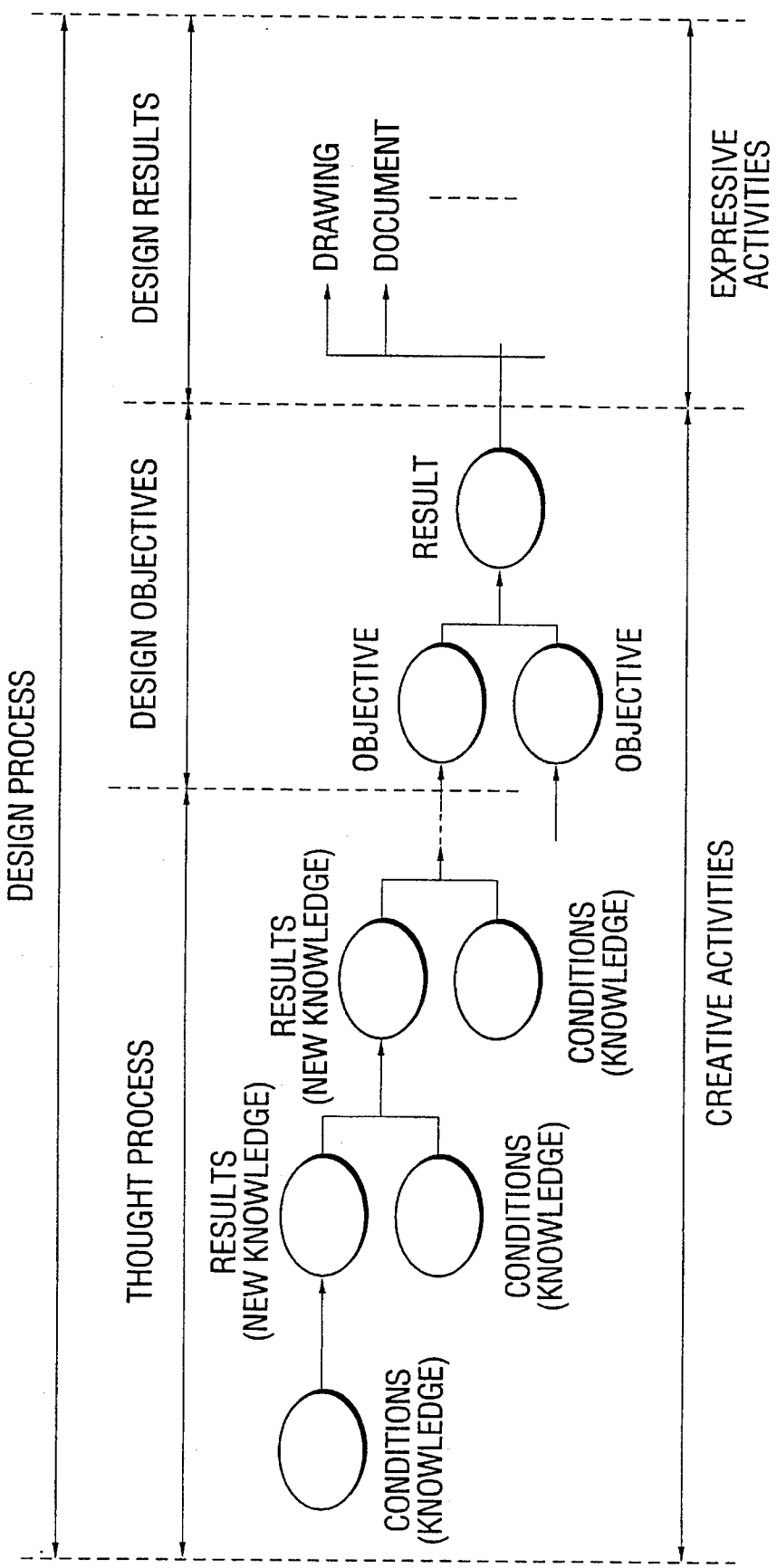
FIG. 1 schematic illustration of the design process of a designer.
Figure 2:
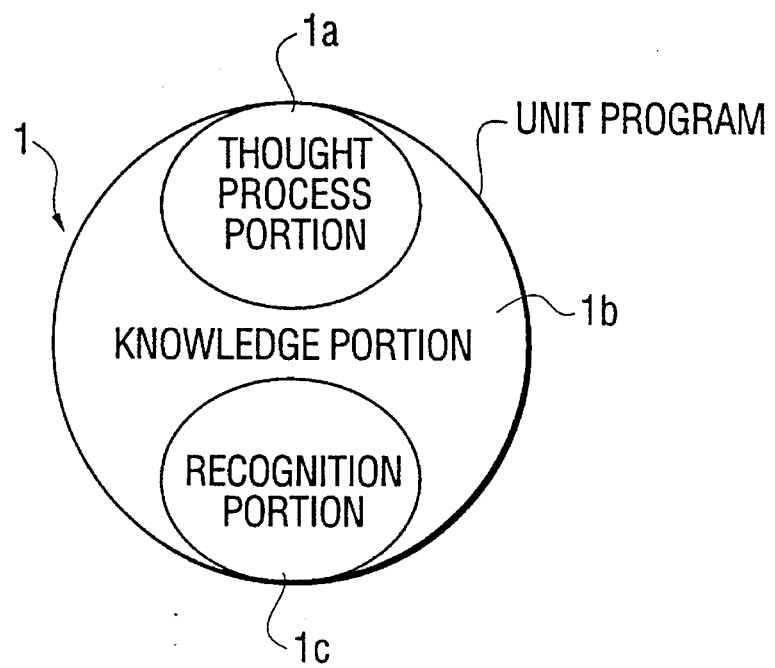
FIG. 2 is a conceptual view depicting a unit program in accordance with the system of the present invention.

Referring initially to FIG. 2, the design system of the present invention is made up of a plurality of unit programs 1 which are respectively prepared for individual design items. For example, considering the case of a building design, a large number of unit programs 1 are individually prepared for various design items, such as a floor design, a pillar design, etc..

Each unit program 1 is made up of a thought process portion 1a, a knowledge portion 1b, and a recognition portion 1c.

Figure 3:
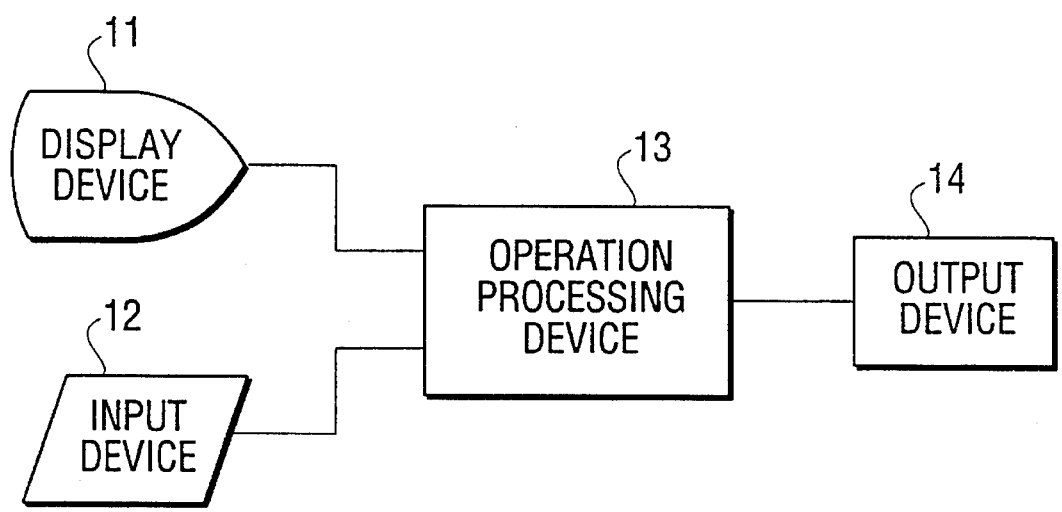
FIG. 3 is a block diagram depicting an apparatus of the present invention.

The thought process portion 1a is for the recognition of seven functions to be performed by the unit program 1 itself (which, for the designer, corresponds to the execution of knowledge related logic). In other words, the thought process portion 1a may be deemed the logic (i.e. conditions and contents of the thought process) section possessed by each unit program 1. The seven functions recognized by the thought process portion 1a and carried out generally by the unit program 1 are enumerated below:

(1) Referring also to FIG. 3 which depicts a block diagram of an apparatus according to the present invention, the unit program 1 functions to display on the display device 11 input request messages for activation of a unit program and input request messages for additional conditions (knowledge) necessary for logic expansion.

(2) The unit program 1 also functions to retrieve input data from an input device 12 responsive to an input request.

(3) The unit program 1 functions to execute logic expansion operations on the basis of the input data.

(4) The unit program 1 also functions to locate, using the recognition portion 1c, another unit program 1 which is related to the results of the executed logic expansion operations, to thereby form a parentage or linkage with another unit program 1.

(5) In the case where another unit program 1 cannot be located which is related to the executed logic expansion operation results (new knowledge), a new unit program 1 related to the new knowledge is created and a parentage with the new unit program 1 is formed.

(6) The logic expansion operation results (new knowledge) are stored as data in the knowledge portion 1b of the unit program 1.

(7) The logic expansion operation results are displayed on the display device 11 or output to the output device 14.

The knowledge area 1b of the unit program 1 is provided for storing (as data) knowledge which serves as a starting point of the thought process simulation (logic expansion operations) of the unit program 1, and for storing new knowledge created as a result of the thought process (which, for the designer, corresponds to the knowledge of the designer).

The recognition portion 1c of the unit program 1 recognizes other unit programs 1 which are related to the results of the executed logic operations (which, for the designer, corresponds to the relationship between knowledge realized by execution of logic operations and other knowledge).

As shown in FIG. 3, an interactive input device 12 is provided in combination with the display device 11, and such are operatively coupled to an operation processing device 13 having an output device 14. The plurality of unit programs 1 are incorporated as software in the operation processing device 13.

The operation of the foregoing embodiment of the computer-aided thought process simulation design system of the present invention will now be described.

The thought process simulation design system of the present invention carries out a process of constructing a hierarchical structure of knowledges through the use of unit programs.

This process may characterized into the following three general functions:

(1) One general unit program function is performed (according to an initial instruction provided by a the designer as to the operation to be executed on the basis of a previously defined procedure in the system in the logic expansion process) in which a unit program related to the content of the instruction is located and the instruction is then transferred to the thus located unit program.

(2) Another general unit program function which is performed is the carrying out of the logic expansion operation (the thought process) according to the content of the instruction given by the designer and transferred to the corresponding unit program.

(3) Another general unit program function is performed when the results of the logic expansion operation (the new knowledge) are found to relate to another unit program, wherein the new knowledge is transferred to the other unit program for other logic expansion operations (other thought processes).

The foregoing unit program functions will be described in more detail with reference to FIGS. 4–6 and 12.

Figure 4:
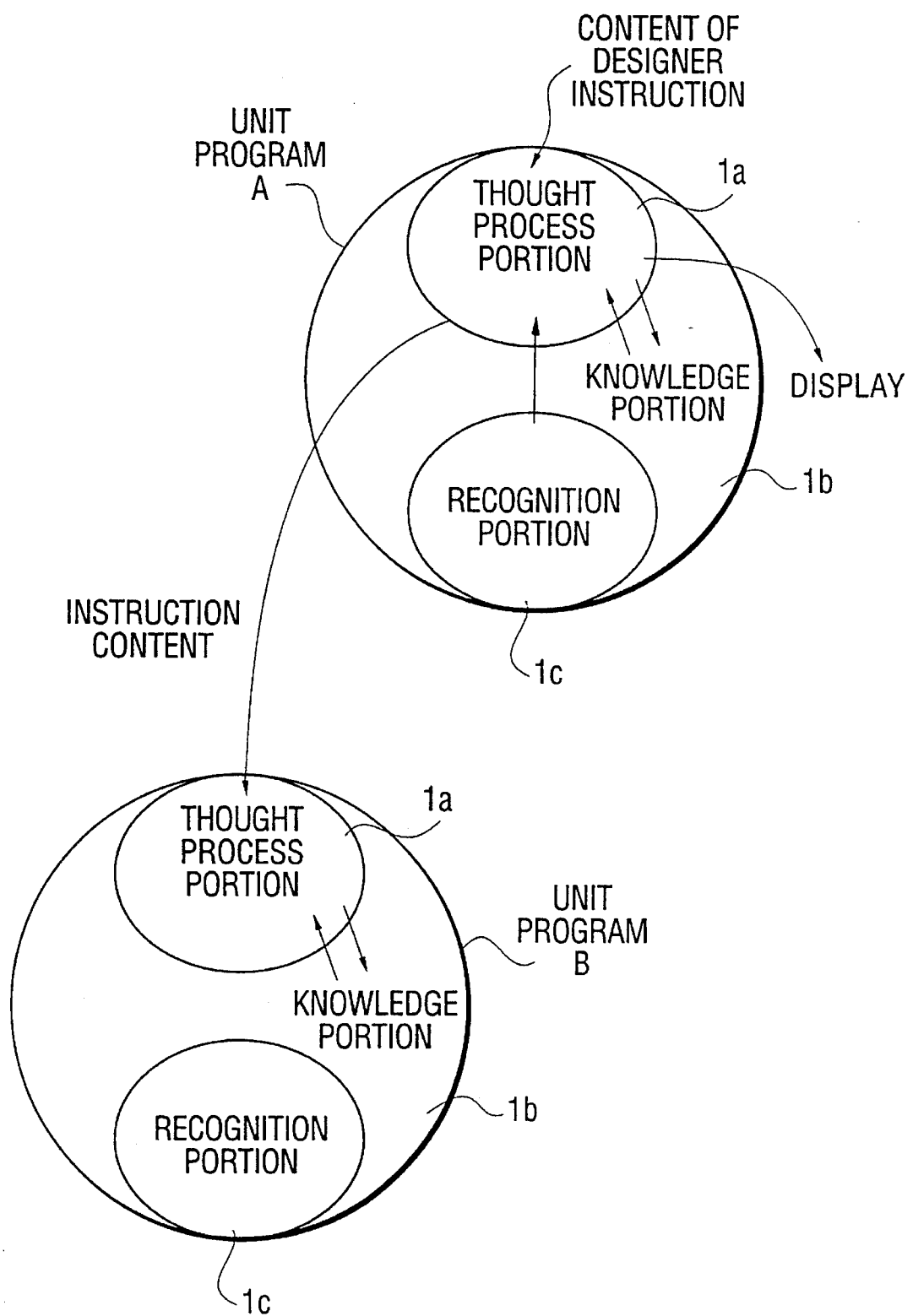
FIGS. 4–6 are conceptual views depicting the linkage of unit programs according to the system of the present invention.

Referring initially to FIG. 4 and FIG. 12(a), an initial instruction is provided by the designer as to the type of logic expansion operation which is to be executed on the basis of previously defined procedures in the system. The unit program which is determined to be related to the content of the instruction is found and the content of the instruction is then transferred to the thus located unit program. Particularly, the following process steps are carried out:

(1-1) An instruction is provided via the input device 12 as to "the action to be executed" on the basis of a previously defined procedure of the system when the designer is carrying out a design process.

(1-2) A unit program A conforming to the content of the instruction (or which is adapted to receive the instruction) is found.

(1-3) The unit program A so found receives the instruction in the thought process portion 1a thereof, and utilizing the recognition portion 1c thereof determines that a unit program B is related to the content of the instruction based on an analysis of the content of the instruction.

(1-4) The content of the instruction is then transferred to the thought process portion 1a of the unit program B.

Figure 5:
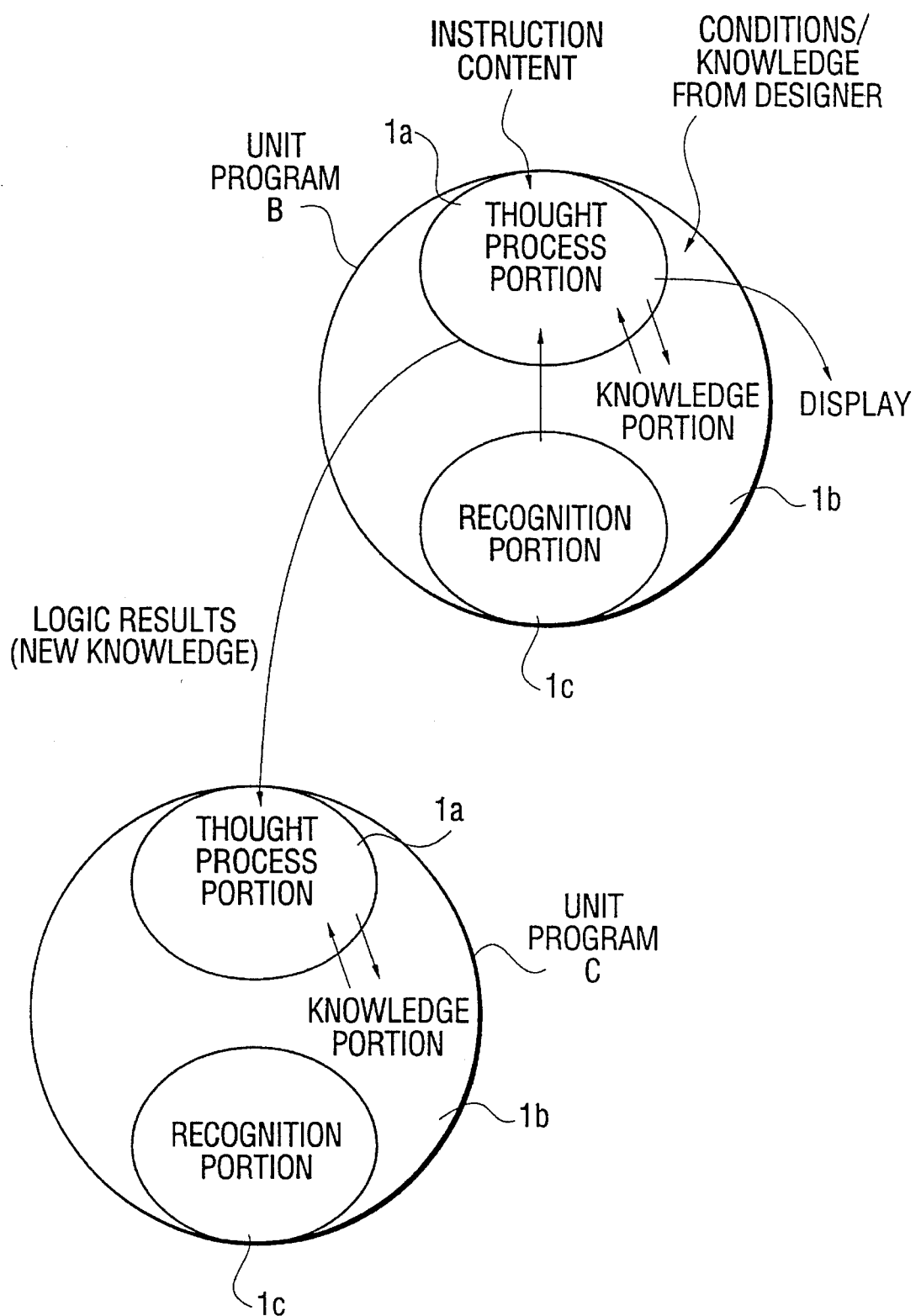

Next, referring to FIG. 5 and FIG. 12(b), the following steps are carried out with respect to the thus recognized unit program B:

(2-1) The unit program B receives the content of the instruction in the thought process portion 1a thereof and displays a request message on the display device 11 as to conditions (knowledge) necessary for execution in accordance with the content of the instruction.

(2-2) Responsive to the input request, the designer uses the input device to input data (conditions/knowledge), and the unit program B inputs data into the knowledge portion 1b of the unit program B.

(2-3) Logic operations (function expressions) related to the input data (condition/knowledge) are executed to achieve logic operation results (new knowledge).

(2-4) The logic operation results (new knowledge) are stored as data in the knowledge portion 1b of the unit program B.

(2-5) The logic operation results (new knowledge) are displayed on the display device 11 or outputted to an output device 14.

(2-6) The recognition portion 1c of the unit program B functions to determine whether the logic operation results (new knowledge) are related to another unit program. That is, in the case where the logic operation results (new knowledge) relates to a unit program C, the recognition portion 1c of the unit program B recognizes this relationship, and the logic operation results (new knowledge) achieved by the unit program B are transferred to the thought process portion 1a of the unit program C.

Figure 6:
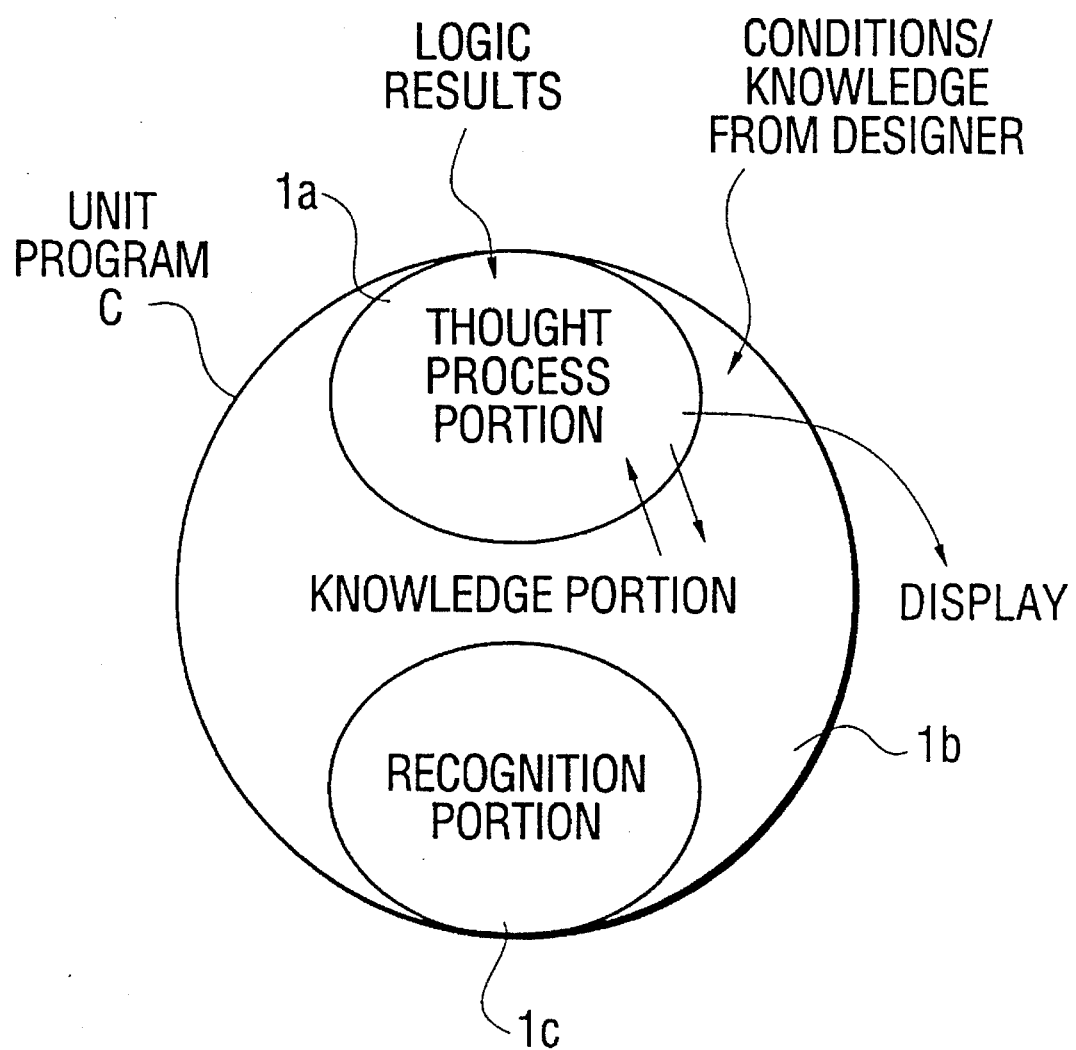
Figure 7:
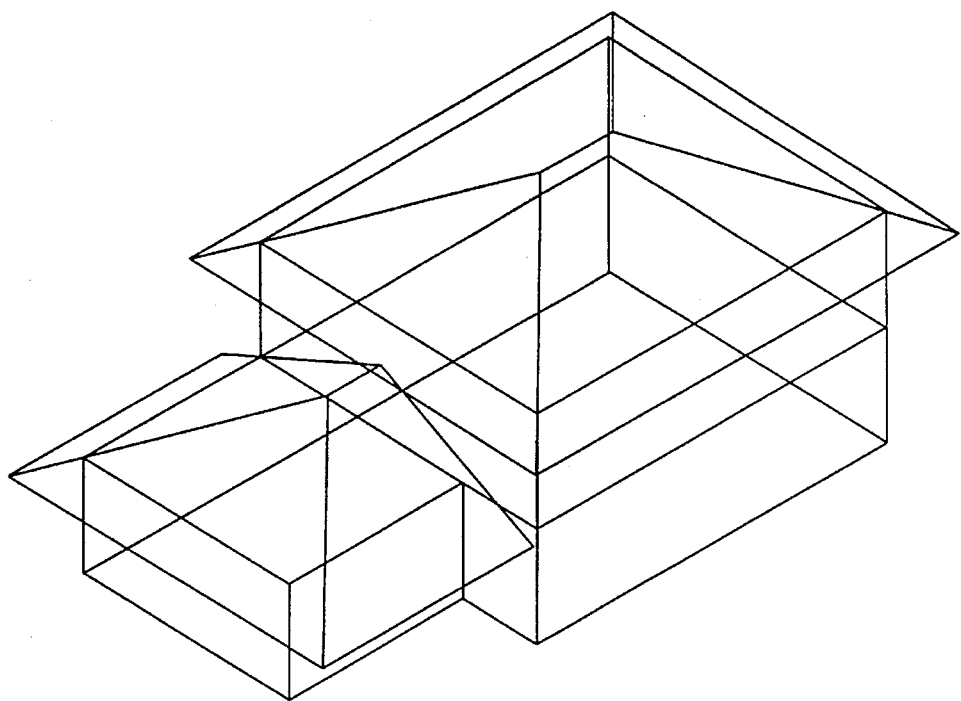
Figure 8:
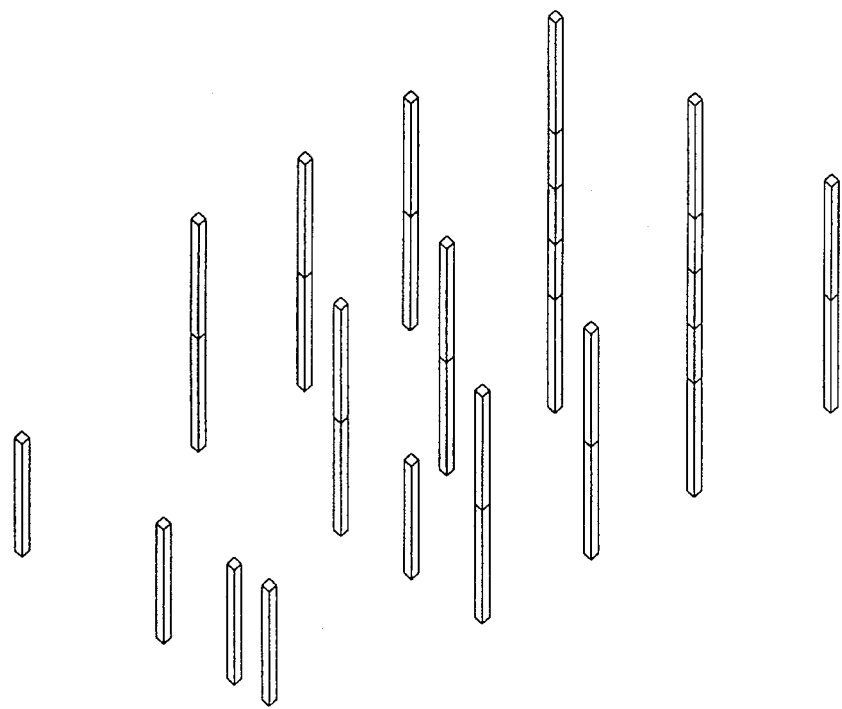
Figure 9:
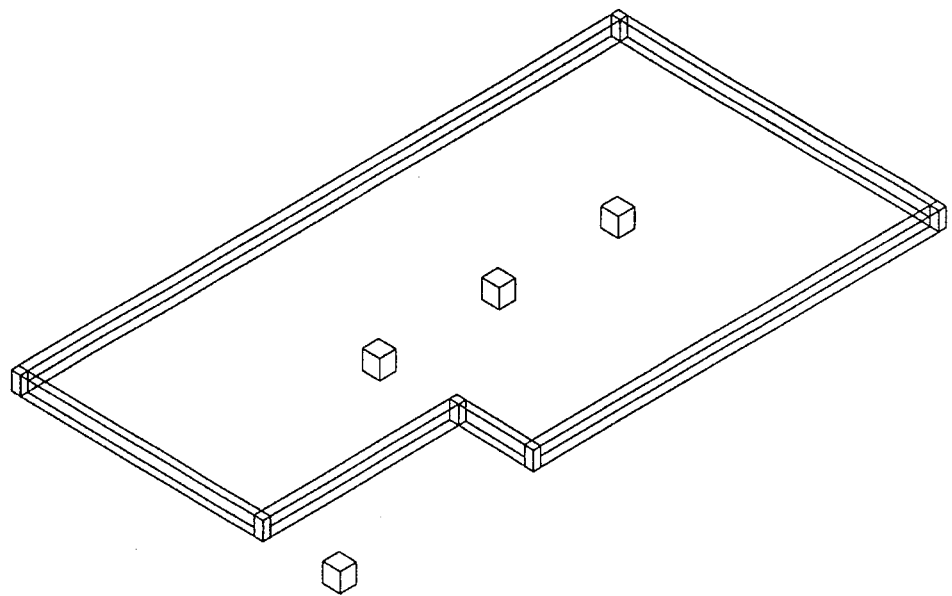
Figure 10:
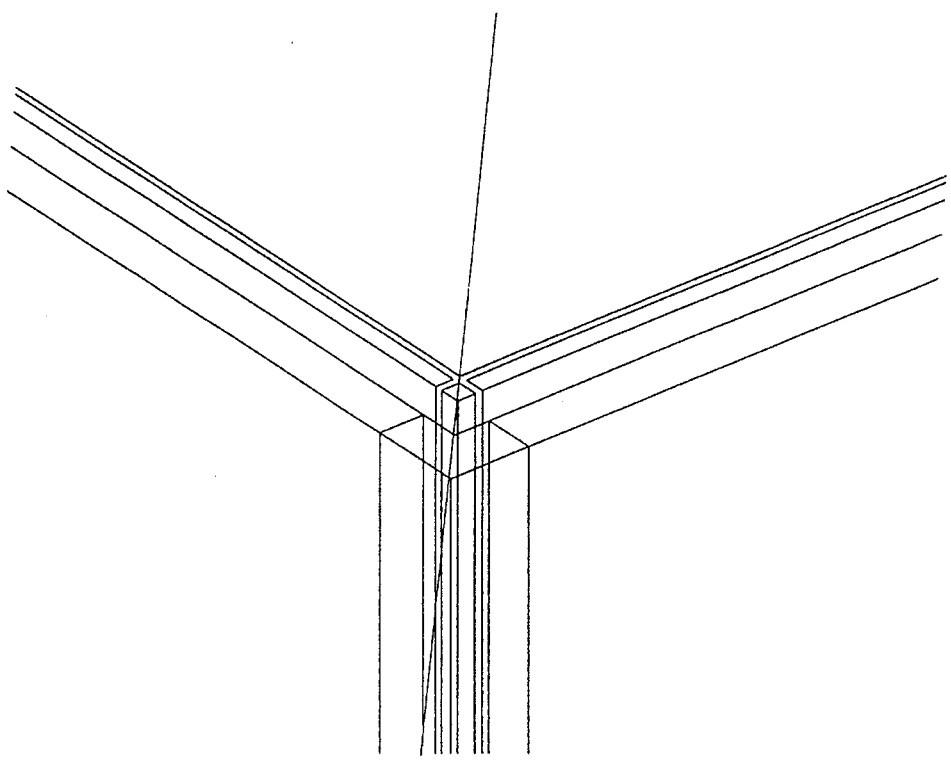

Referring now to FIG. 6 and FIG. 12(c), the operation of the unit program C includes the following steps:

(3-1) The unit program C receives the new knowledge in the thought process portion 1a thereof and displays on the display device 11 an input request message to the designer requesting inputting of necessary conditions (knowledge) for execution of the logic operations related to the received new knowledge.

(3-2) (The same as step 2-2 above).

(3-3) (The same as step 2-3 above).

(3-4) (The same as step 2-4 above).

(3-5) (The same as step 2-5 above).

By recognition of the unit programs in the manner discussed above, a hierarchical structure of the thought processes of the designer is constructed and simulated.

When the designer inputs a particular design to be carried out via the input device 12, a unit program 1 to be initially processed is activated.

Then, the designer executes the processing according to the thought process portion 1a of the unit program 1.

In the course of this processing, the unit program 1, using the recognition portion 1c, recognizes another unit program to be processed and establishes a link therebetween in which instructions and/or new knowledge are transferred.

In response, the other unit program 1 is activated via the link at the termination of execution or during the course of execution of the initial unit program 1, and the necessity of executing the other unit program 1 is indicated to the designer and the other unit program 1 is executed accordingly.

Further, for execution of the unit programs, data stored in the knowledge portion 1b of the unit program 1 is used as design data. Further, the results of the unit program execution are stored in the knowledge portion 1b of the particular unit program 1.

As is readily apparent from the foregoing description, the designer by use of the present invention is able to perform design processes in which the procedure of the design process is not fixed. Such is in clear contrast to the conventional design processing systems and the preset processing flows thereof.

According to the present invention, data denoting the design results is retrieved from the unit program 1 upon completion of the design process or during the course of the design process, and such data is outputted to one of a plotter, printer, a display device, etc., for display in the form of three-dimensional graphic, two-dimensional graphic, or list illustration. FIGS. 7–10 depicts examples of three-dimensional graphic illustrations, and FIG. 11 depicts an example of a list illustration.

Figure 13B:
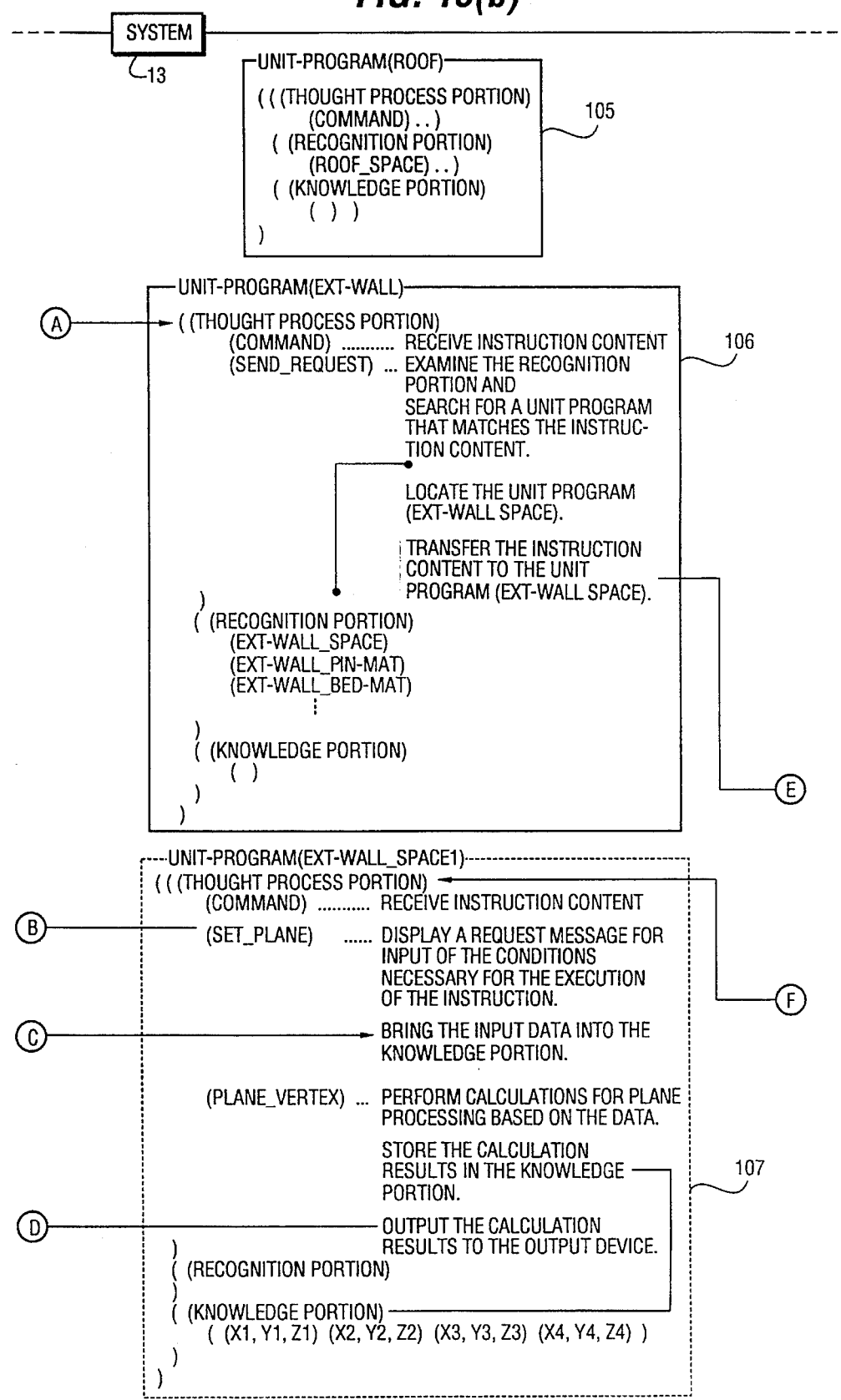
Figure 14A:
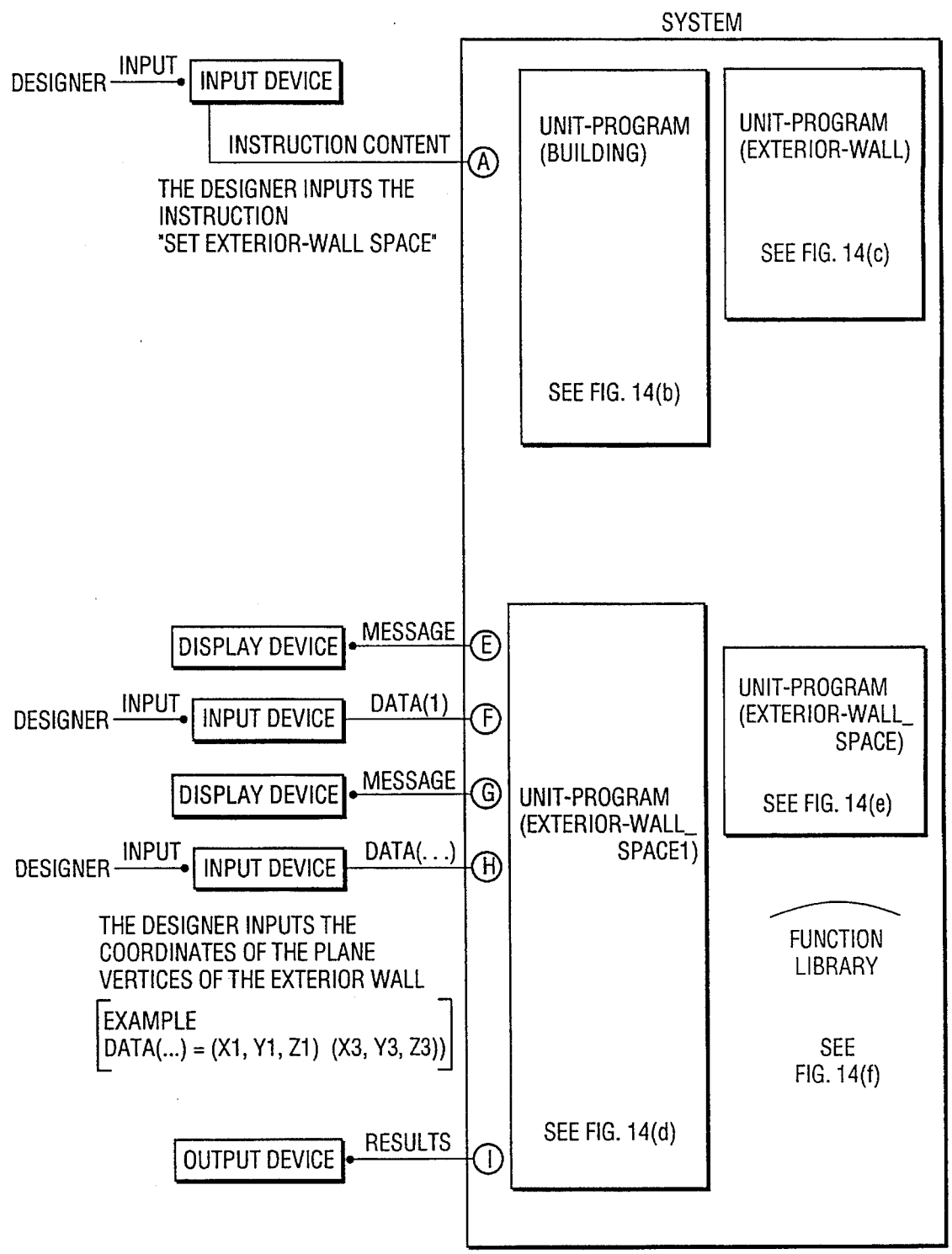
Figure 14B:
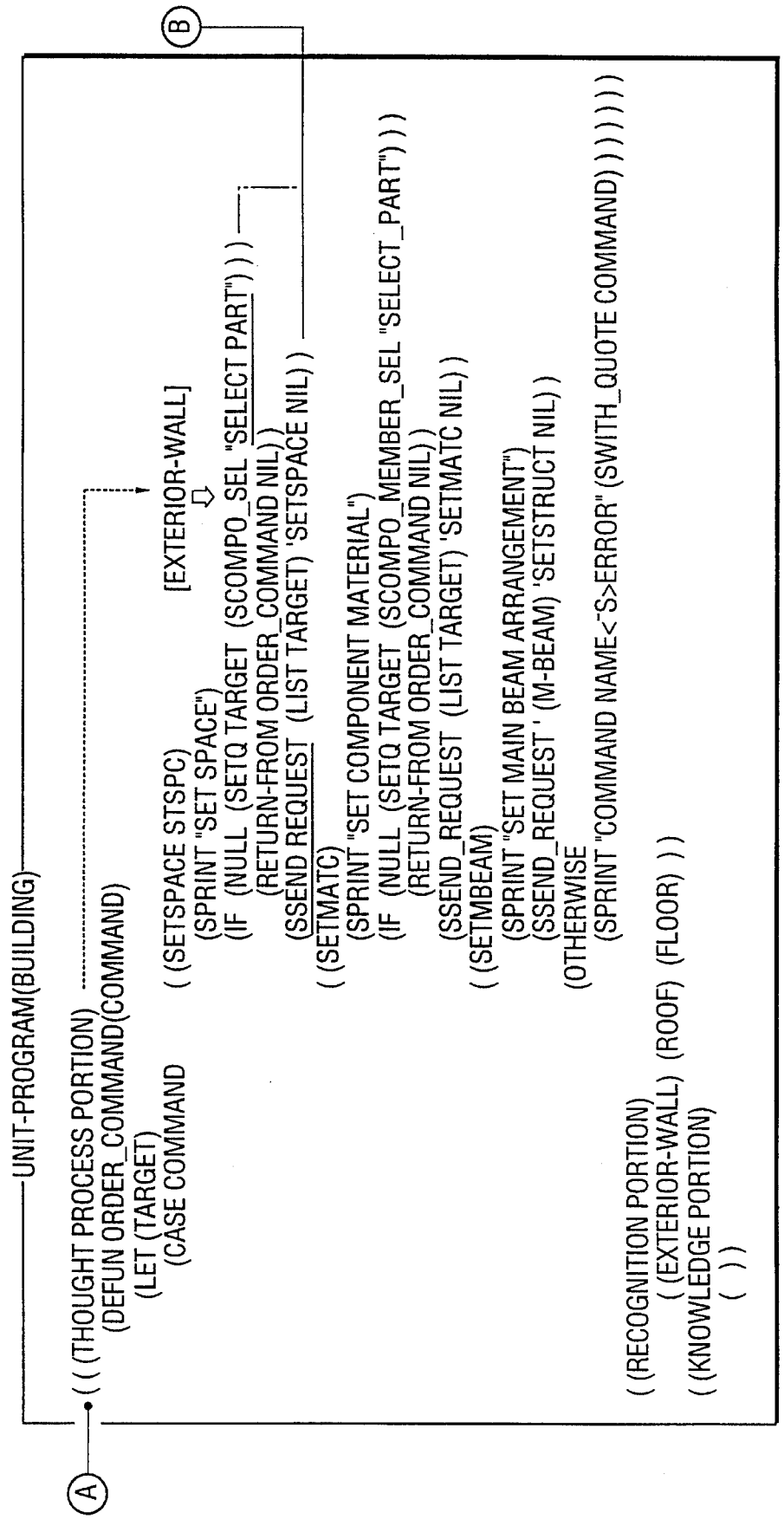
Figure 14C:
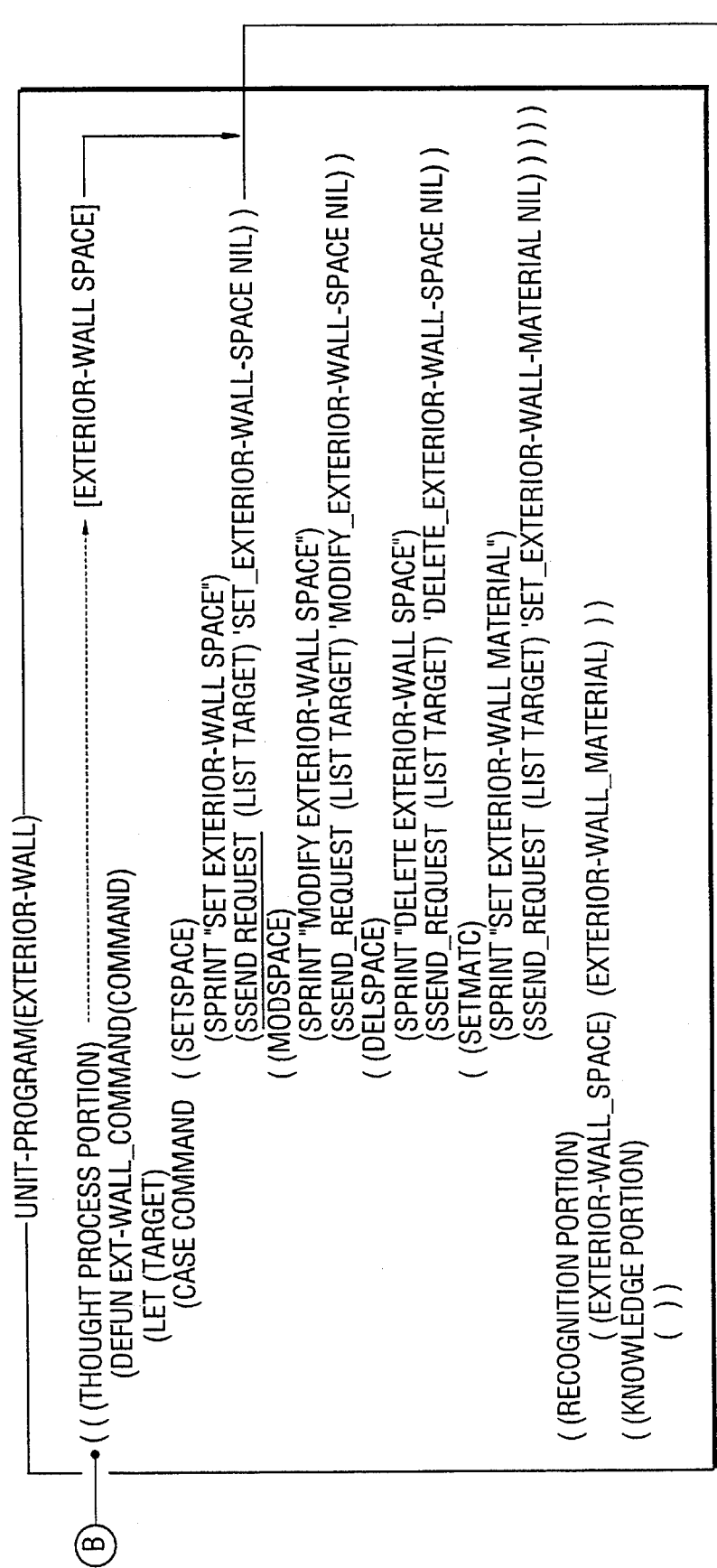
Figure 14F:
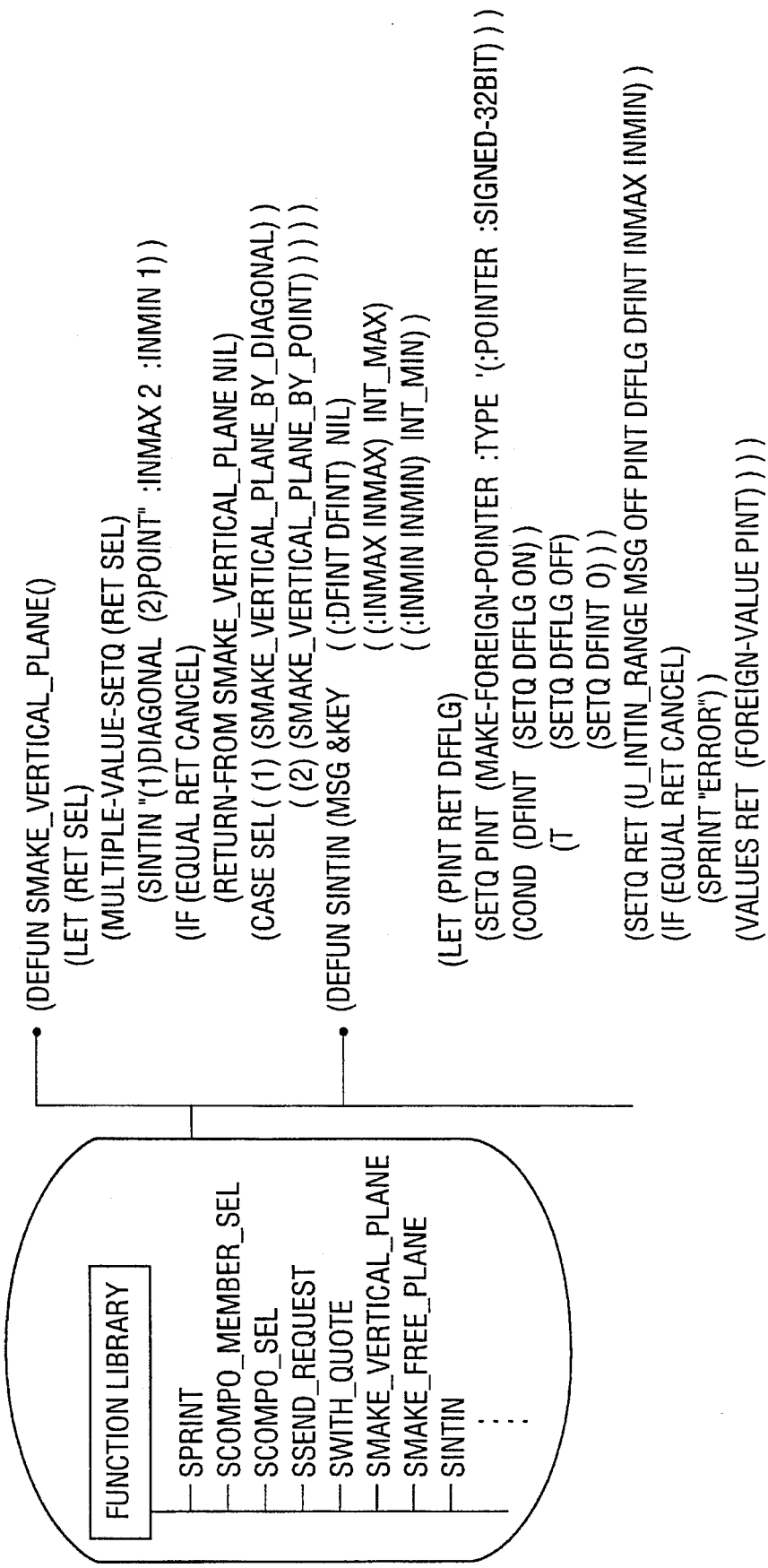

FIG. 13 depicts a conceptual illustration of the present invention in which nine unit programs are available (the actual number of unit programs is, of course, likely to be much larger). Particularly, the following unit programs are loaded in the system 13:

unit-program[BUILDING] 101, unit-program[STRUCT] 102, unit-program[BEAM] 103, unit-program[FLOOR] 104, unit-program[ROOF] 105, unit-program[EXT-WALL] 106, unit-program[EXT-WALL_SPACE1] 107, unit-program[ROOF_PIN-MAT] 108, and unit-program[EXT-WALL_SPACE] 109.

The system 13 also includes a function library 200 which is a library of functions defined in the thought process portion of each unit program. During operation of a unit program, the function library 200 is referenced to execute unit program functions.

Initially, the designer inputs, for example, the instruction "set exterior wall space". The instruction content is loaded into the unit-program[BUILDING] 101. The recognition portion of the unit-program[BUILDING] 101 is used to identify the unit program which is related to the instruction content. In this case, the unit-program[EXT-WALL] 106 is identified and the instruction content is transferred thereto. Again, the unit-program[EXT-WALL] 106 identifies another unit program related to the instruction content. In this case, the instruction content is again transferred to the unit-program[EXT-WALL_SPACE] 109. Once again, the instruction content is transferred by the unit-program[EXT-WALL_SPACE] 109 to the unit-program[EXT-WALL_SPACE1] 107.

The unit-program [EXT-WALL_SPACE1] 107 outputs a message via the display device 11 to the designer requesting additional information which may be necessary to carry out the unit program functions. The additional information is received via the input device 12 and calculations are carried out. The results of the calculations are stored in the knowledge portion and output via the output device 14.

FIG. 14 illustrates in a more detailed manner the operation scheme discussed above with respect to FIG. 13. The program language shown in FIG. 14 is "LISP", and the machine to which the system operation of FIG. 14 may be applied is the FACOM-G250C (Fujitsu). As described above and as shown in FIG. 2, each UNIT-PROGRAM consists of three portions, " Thought Process Portion", Knowledge Portion" and "Recognition Portion".

These portions have the following functions:

1. Thought Process Portion—Executes processes such as a logic calculation process on the basis of conditions and contents of thought.

2. Knowledge Portion—Stores knowledge (data) for conducting thought (logic process), and results of thought.

3. Recognition Portion—Recognizes the relation of the unit program to the other unit programs.

The contents of these functions vary depending on the UNIT-PROGRAMs (design items). In the case of UNIT-PROGRAM [EXTERIOR-WALL}, for example, the portions have only the contents relating to UNIT-PROGRAM [EXTERIOR-WALL] itself as shown below.

THOUGHT PROCESS PORTION

1. Receives a message and data, and transfers a message and data to another UNIT-PROGRAM.

2. Judges whether or not the contents of the message and data relate to the logic process owned by itself.

3. If the contents relate to the logic process, issues a request to input of conditions required for executing the logic process (displays a request message on the display device).

4. Enters input conditions (data) into Knowledge Portion.

5. Performs a calculation process for an exterior wall on the basis of the data.

6. Stores results of the calculation process into Knowledge Portion.

7. Displays the results of the calculation process (outputs them to the output device).

KNOWLEDGE PORTION (Coordinates of the exterior wall, [(X1, Y1, Z1) (X2, Y2, Z2) (X3, Y3, Z3) (X4, Y4, Z4)]).

RECOGNITION PORTION (UNIT-PROGRAM [EXTERIOR-WALL-FIN-MATERIAL]).

(UNIT-PROGRAM [EXTERIOR-WALL-BED-MATERIAL]).

The flow of messages and data between the UNIT-PROGRAMs and the logic calculation process are described below with reference to FIGS. 15–24, each showing message and data transfer among unit programs.

Figure 15:
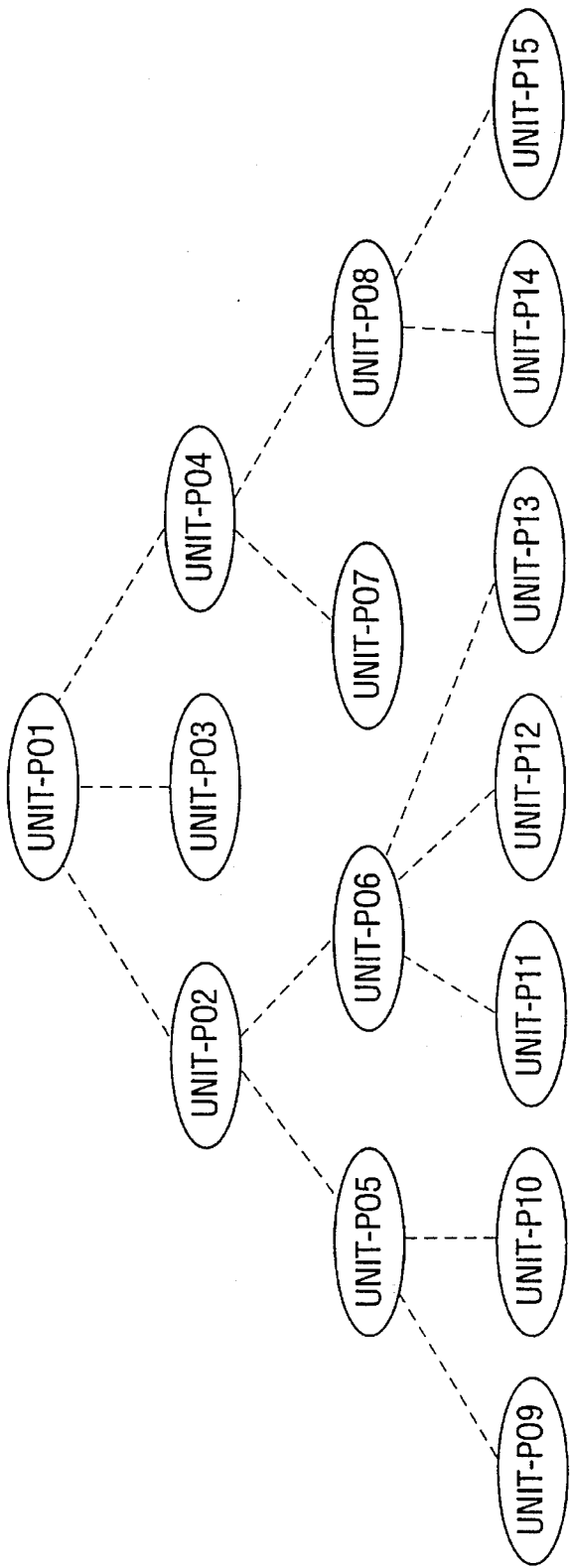
FIGS. 15–24 are diagrams for explaining message and data transfer among unit programs according to the present invention.

It is assumed that, as shown in the FIG. 15, UNIT-PROGRAMs and relations indicated by the illustrated broken lines are established.

In this case, a UNIT-PROGRAM has a relation with another UNIT-PROGRAM connected through a broken line, and "NAMEs (TITLEs)" of the related UNIT-PROGRAMs are stored in Recognition Portions of these UNIT-PROGRAMs.

In this case where:

UNIT-P01 is UNIT-PROGRAM [BUILDING],

UNIT-P02 is UNIT-PROGRAM [EXTERIOR-WALL],

UNIT-P03 is UNIT-PROGRAM [ROOF], and

Figure 16:
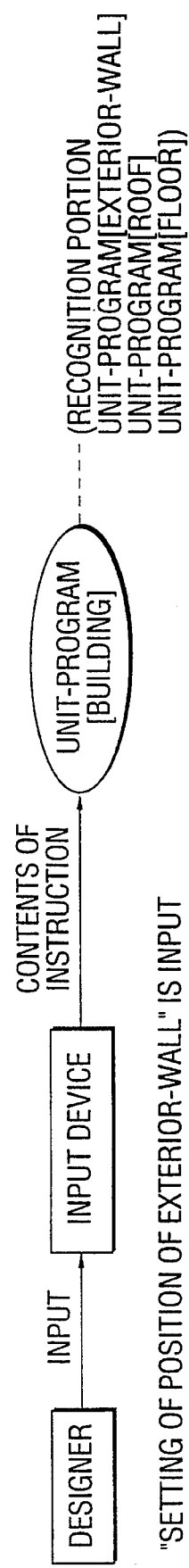

UNIT-P04 is UNIT-PROGRAM [FLOOR], for example, when it is assumed that UNIT-PROGRAM [BUILDING] receives an instruction for "DECISION OF THE POSITION OF EXTERIOR-WALL" from the designer, the process shown in FIG. 16 is conducted.

UNIT-PROGRAM [BUILDING] retrieves a UNIT-PROGRAM(s) relating to itself from Recognition Portion.

Figure 17:
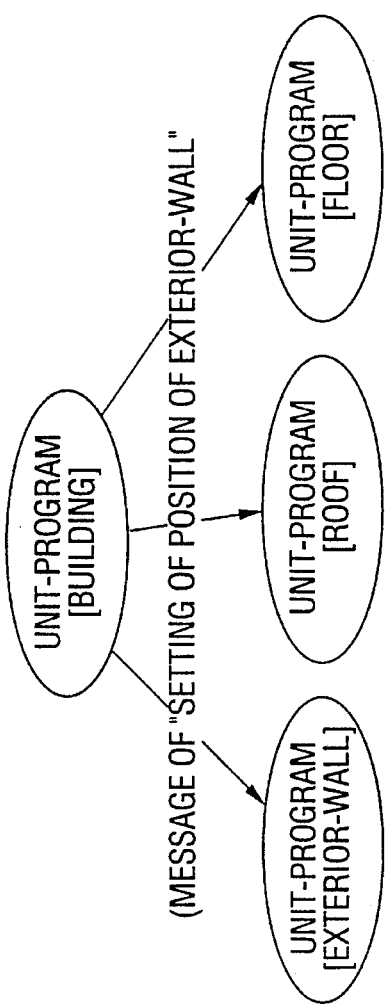

As shown in FIG. 17, UNIT-PROGRAM [BUILDING] transfers (transmits) the message of "SETTING OF POSITION OF EXTERIOR-WALL" to related UNIT-PROGRAMs [EXTERIOR-WALL], [ROOF], and [FLOOR].

UNIT-PROGRAMs [EXTERIOR-WALL], [ROOF], and [FLOOR] which have received the message of 'SETTING OF POSITIONS 0F EXTERIOR-WALL" judge whether or not the contents of the message relate to the logic process of Thought Process Portion of themselves.

In this case, only the logic process relating to EXTERIOR-WALL exists in Thought Process Portion of UNIT-PROGRAM [EXTERIOR-WALL], only the logic process relating to ROOF exists in Thought Process Portion of UNIT-PROGRAM [ROOF], and only the logic process relating to FLOOR exists in Thought Process Portion of UNIT-PROGRAM [FLOOR].

Figure 18:
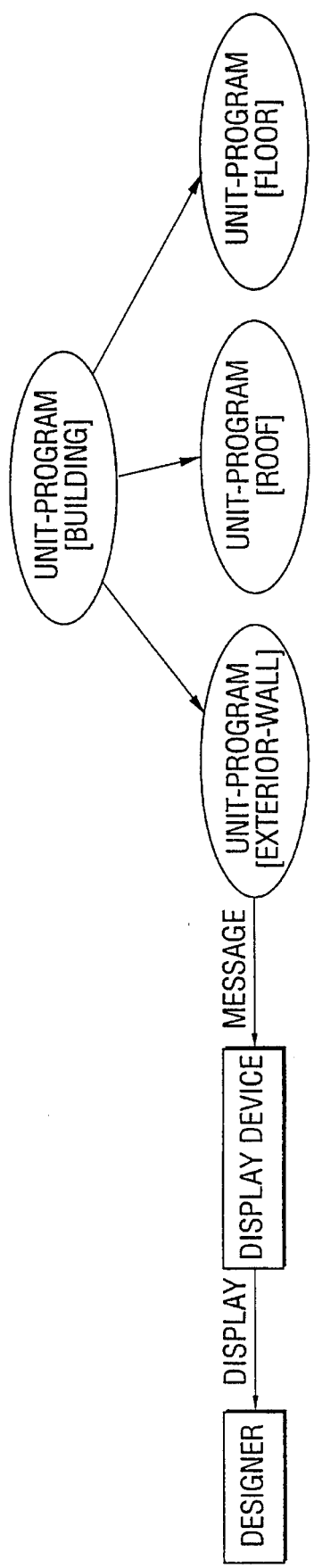

Naturally, therefore, only UNIT-PROGRAM [EXTERIOR-WALL] is activated. As a results, as shown in FIG. 18, by means of the Thought Process Portion of UNIT-PROGRAM [EXTERIOR-WALL], a request to input of conditions (data) required for "SETTING OF POSITIONS OF EXTERIOR-WALL" is issued. (A message of a request to input is displayed on the display device.)

Figure 19:
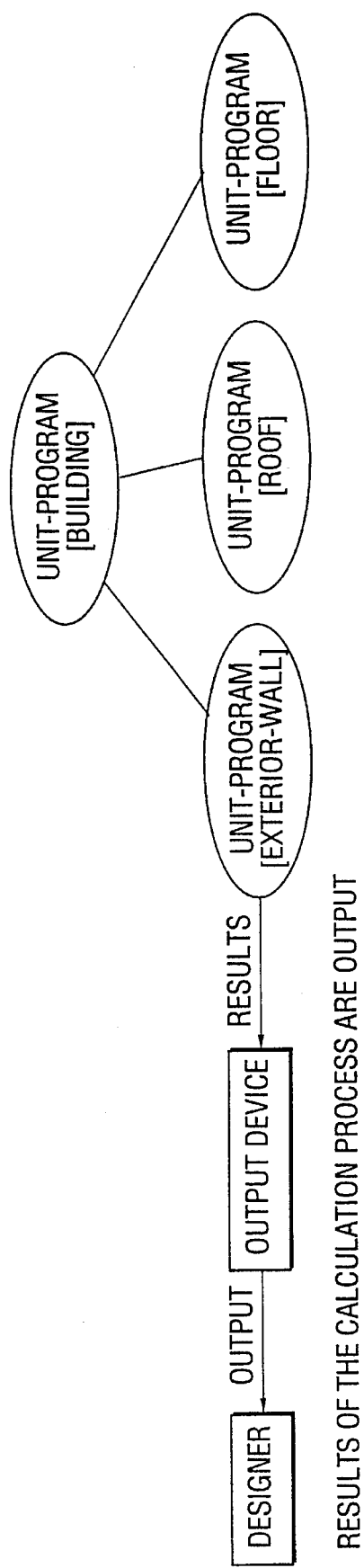

UNIT-PROGRAM [EXTERIOR-WALL] which has received the input data conducts the logic calculation process on the basis of the input data. Results of the calculation process are stored in the Knowledge Process Portion, and output to the output device as shown in FIG. 19.

In another case where:

UNIT-P06 is UNIT-PROGRAM [EXTERIOR-WALL-FIN-MATERIAL], and

Figure 20:
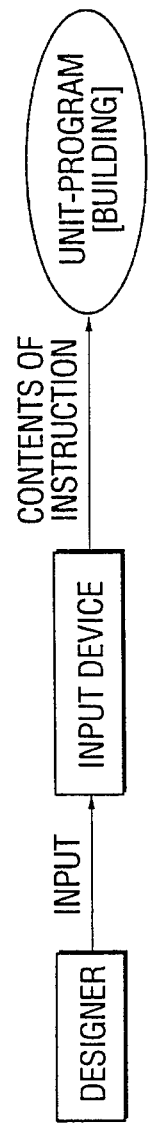

UNIT-P06 is UNIT-PROGRAM [EXTERIOR-WALL-BED-MATERIAL] as shown in FIG. 15, when it is assumed that UNIT-PROGRAM [BUILDING] receives an instruction for "SETTING OF A FINISHING MATERIAL OF EXTERIOR-WALL" (or the instruction is input), the process shown in FIG. 20 is conducted.

Figure 21:
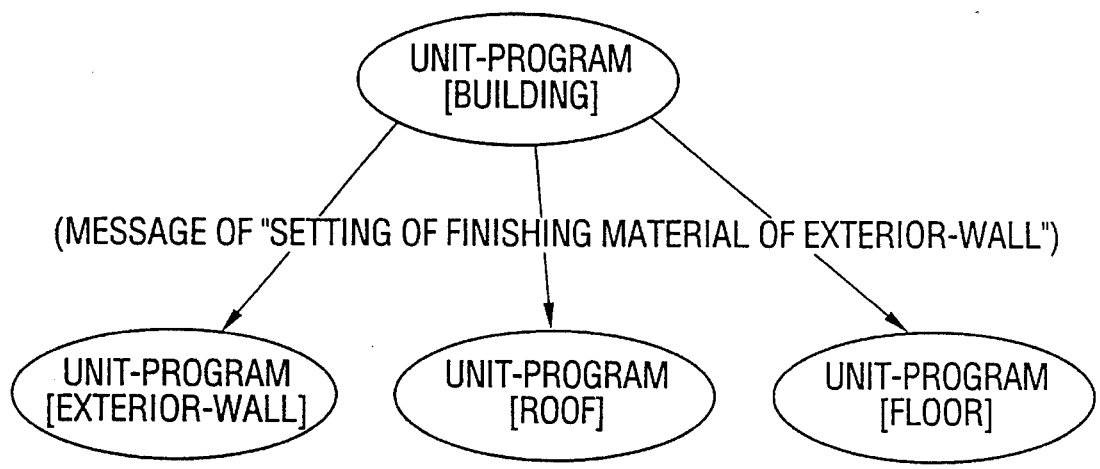

Similarly, as shown in FIG. 21, UNIT-PROGRAM [BUILDING] transfers (transmits) the message of "SETTING OF A FINISHING MATERIAL OF EXTERIOR-WALL" from the Recognition Portion to UNIT-PROGRAMs [EXTERIOR-WALL], [ROOF], and [FLOOR].

UNIT-PROGRAMs [EXTERIOR-WALL], [ROOF], and [FLOOR] which have received the message of "SETTING OF A FINISHING MATERIAL OF EXTERIOR-WALL" judge whether or not the contents of the message relate to the logic process of Thought Process Portion of themselves. In the same manner as the foregoing example, since the instruction contents relate to EXTERIOR-WALL, UNIT-PROGRAM [EXTERIOR-WALL] is activated.

Figure 22:
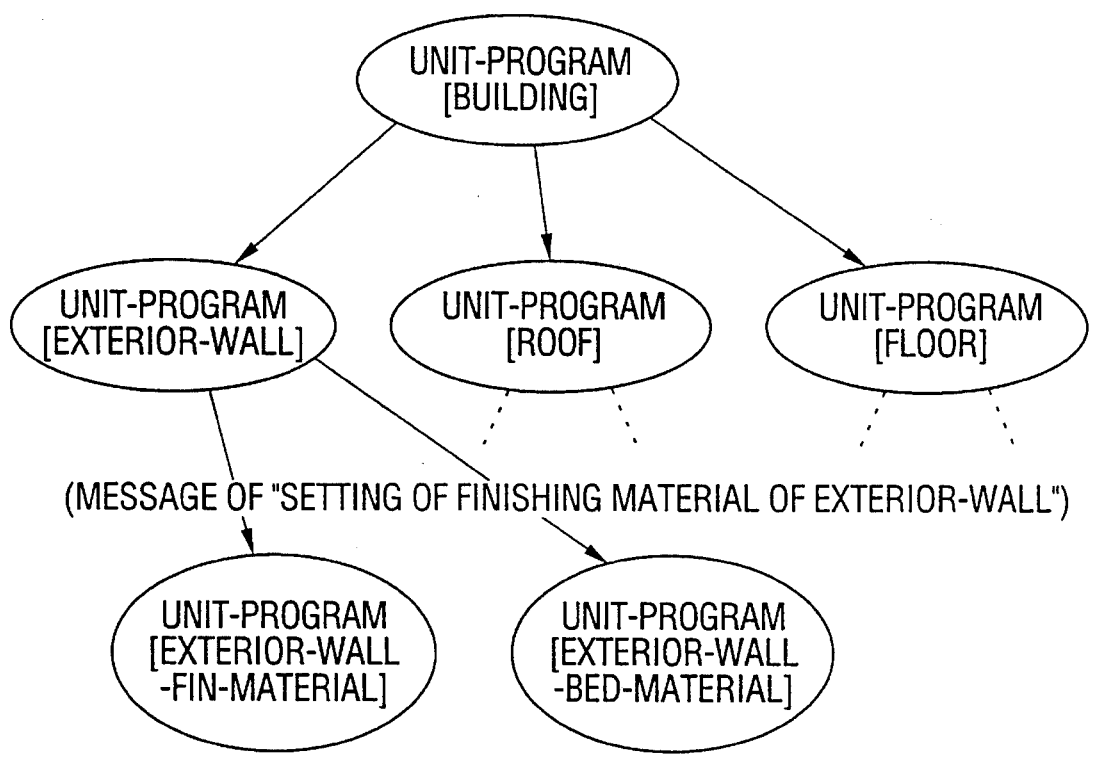

In this case, since the instruction contents relate to "FINISHING MATERIAL OF EXTERIOR-WALL", the logic process of UNIT-PROGRAM [EXTERIOR-WALL] itself is not conducted, and a related UNIT-PROGRAM(s) is retrieved from Recognition Portion. Since the related UNIT-PROGRAMs are UNIT-PROGRAM [EXTERIOR-WALL-FIN-MATERIAL] and UNIT-PROGRAM [EXTERIOR-WALL-BED-MATERIAL], the message of "SETTING OF A FINISHING MATERIAL OF EXTERIOR-WALL" is transferred (transmitted) to these UNIT-PROGRAMs as shown in FIG. 22.

UNIT-PROGRAM [EXTERIOR-WALL-FIN-MATERIAL] and UNIT-PROGRAM [EXTERIOR-WALL-BED-MATERIAL] which have received the message of "SETTING OF A FINISHING MATERIAL OF EXTERIOR-WALL" judge whether or not the contents of the message relate to the logic process of Though Process Portion of themselves.

Figure 23:
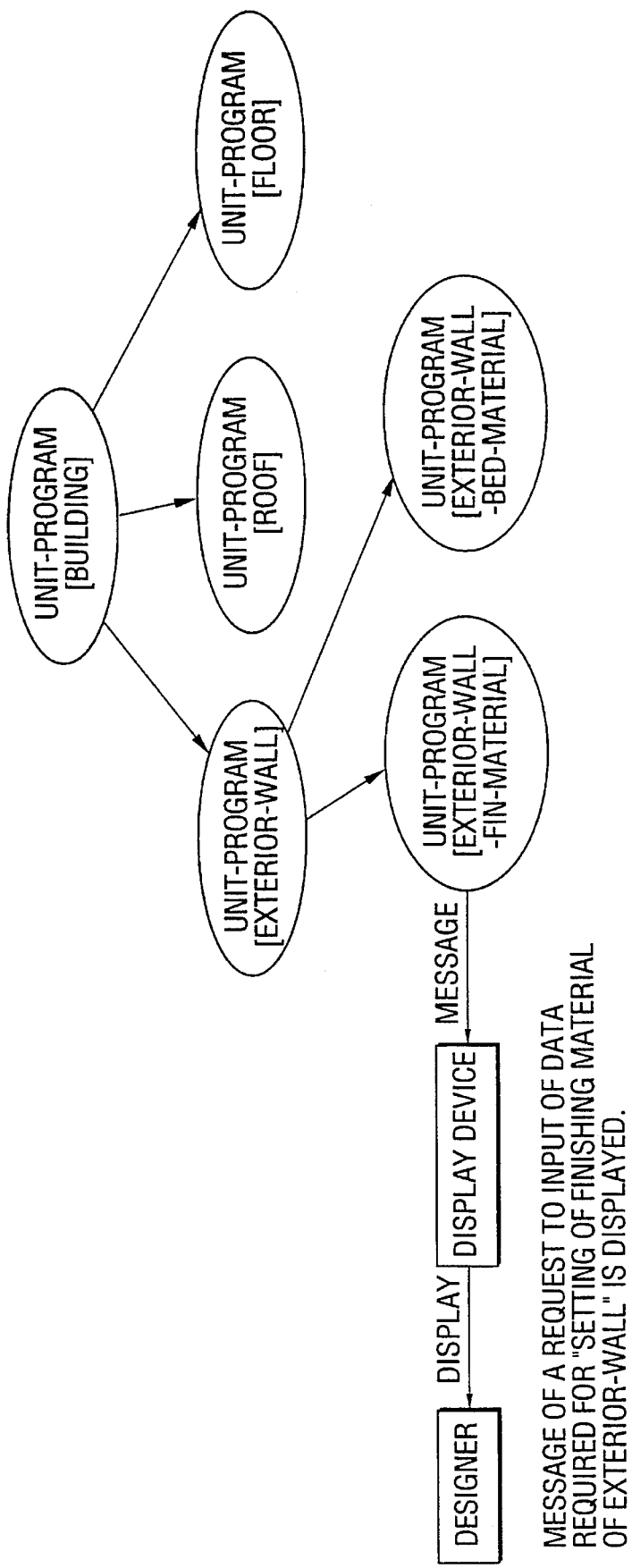

Also in this case, UNIT-PROGRAM [EXTERIOR-WALL-FIN-MATERIAL] having as a function the logic process relating to the finishing material of EXTERIOR-WALL is activated, and, as shown in FIG. 23, request to input of conditions (data) required for "SETTING OF A FINISHING MATERIAL OF EXTERIOR-WALL" is issued (a message of a request to input is displayed on the display device).

Figure 24:
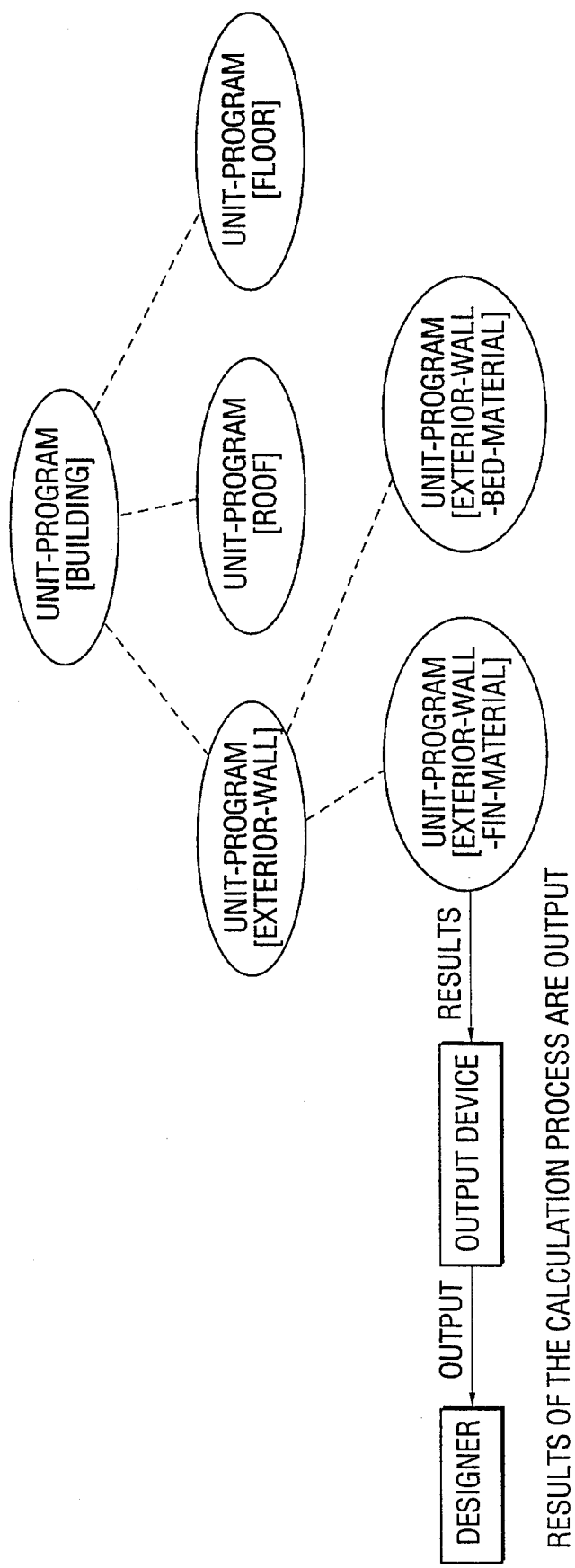

UNIT-PROGRAM [EXTERIOR-WALL-FIN-MATERIAL] conducts the logic circulation process on the basis of the input data. Results of the process are stored in Knowledge Portion, and output to the output device as shown in FIG. 24.

As discussed above, the present invention includes a mechanism in which each UNIT-PROGRAM is activated in accordance with the function described in the Thought Process Portion, a message and data are transferred (transmitted) to all related UNIT-PROGRAMs which are stored in the Recognition Portion, and only a UNIT-PROGRAM having as a function the logic process relating to the message and data is activated.

The computer-aided thought process simulation design system of the present invention includes, among others, the following advantages:

(1) Since the design system of the invention is prepared as a set of unit programs, it is readily adaptable to the task of designing a new product through the addition of necessary new unit programs. Thus, the present invention eliminates the need of preparing a new system for each new product.

(2) Further, the design system of the present invention greatly facilitates a design change since the system is designed in the form of a plurality of unit programs provided respectively for individual design items and since a preset processing flow is not carried out.

(3) Similarly, the design system according to the present invention facilitates prompt design simulation for new products since the unit programs are particularly designed for each respective design item

We claim:

1. A computer-aided design system comprising:

an input device;

a display device; and, processing means including a plurality of discrete unit programs which are operatively independent from each other and which are provided respectively for discrete design items, each of the plurality of discrete unit programs including a thought process portion, a knowledge portion and a recognition portion, wherein said thought process portion of each unit program includes means for receiving at least one of an input instruction via said input device and logic results from another unit program, executing logic operations when received logic results are associated with said logic operations in accordance with the input instruction to obtain logic results and transferring the logic results to all of a plurality of related unit programs, wherein said knowledge portion of each unit program includes means for storing the logic results, and wherein said recognition portion of each unit program includes means for identifying the plurality of related unit programs which are related to the logic operations of said each unit program;

said processing means, responsive to an input user instruction, for processing a first discrete unit program associated with a user selected design item to cause the first discrete unit program to obtain first logic results and identify a plurality of related second discrete unit programs and transfer the first logic results to all of the related second discrete unit programs, processing all of the related second discrete unit programs to determine at least one related second discrete unit program which is for executing logic operations associated with the transferred first logic results, and for then activating in succession the at least one related second discrete unit program having logic operations associated with the transferred first logic results and any subsequent related discrete unit programs identified during processing of a preceding discrete unit program.

2. A system as recited in claim 1, wherein said thought process portion further includes means for requesting via said display device information which is necessary for executing the logic operations.

3. A system as recited in claim 1, wherein said thought process portion further includes means for receiving logic results from a discrete unit program and executing logic operations in accordance with the received logic results to obtain new logic results.

4. A system as recited in claim 2, wherein said thought process portion further includes means for receiving logic results from a discrete unit program and executing logic operations in accordance with the received logic results to obtain new logic results.

5. A system as recited in claim 2, wherein said knowledge portion includes means for storing the information which is necessary for executing the logic operations and which is input via said input device.

6. A system as recited in claim 4, wherein said knowledge portion includes means for storing the information which is necessary for executing the logic operations and which is input via said input device.

7. A system as recited in claim 1, further comprising a plotter for illustrating a representation of the logic results.

8. A system as recited in claim 2, further comprising a plotter for illustrating a representation of the logic results.

9. A system as recited in claim 3, further comprising a plotter for illustrating a representation of the logic results.

10. A system as recited in claim 4, further comprising a plotter for illustrating a representation of the logic results.

11. A system as recited in claim 5, further comprising a plotter for illustrating a representation of the logic results.

12. A system as recited in claim 6, further comprising a plotter for illustrating a representation of the logic results.

13. A computer-aided design method comprising preparing and incorporating into a computer system a plurality of discrete unit programs which are operatively independent from each other, wherein each of the programs is provided in association with a respective design item and each includes a thought process portion, a knowledge portion, and a recognition portion, wherein the thought process portion of each unit program is prepared for receiving at least one of an input instruction via an input device of the computer system and logic results from another unit program, executing logic operations when received logic results are associated with said logic operations in accordance with the input instruction to obtain logic results and transferring the logic results to a plurality of related unit programs, wherein the knowledge portion of each unit program is prepared for storing the logic results, and wherein the recognition portion of each unit program is prepared for identifying the plurality of related unit programs which are related to the logic operations of said each unit program, and wherein, responsive to an input user instruction, a first discrete unit program associated with a user selected design item is processed to cause the first discrete unit program to obtain first logic results and identify a plurality of related second discrete unit programs and transfer the first logic results to all the related second discrete unit programs, all of the related second discrete unit programs are processed to determine at least one related second discrete unit program which is for executing logic operations associated with the transferred first logic results, and then in succession the at least one related second discrete unit program having logic operations associated with the transferred first logic results and any subsequent related discrete unit programs identified during processing of a preceding discrete unit program are processed.

14. A method as recited in claim 13, wherein said thought process portion is further prepared for requesting via a display device of the computer system information which is necessary for executing the logic operations.

15. A system as recited in claim 13, wherein said thought process portion is further prepared for receiving logic results from another discrete unit program and executing logic operations in accordance with the received logic results to obtain new logic results.

16. A method as recited in claim 14, wherein said thought process portion is further prepared for receiving logic results from another discrete unit program and executing logic operations in accordance with the received logic results to obtain new logic results.

17. A system as recited in claim 14, wherein said knowledge portion is further prepared for storing the information which is necessary for executing the logic operations and which is input via an input device of the computer system.

18. A method as recited in claim 16, wherein said knowledge portion is further prepared for storing the information which is necessary for executing the logic operations and which is input via an input device of the computer system.

* * * * *